United States Patent
Hughes et al.

(10) Patent No.: US 7,571,396 B2
(45) Date of Patent: Aug. 4, 2009

(54) SYSTEM AND METHOD FOR PROVIDING SWAP PATH VOLTAGE AND TEMPERATURE COMPENSATION

(75) Inventors: Thomas Hughes, San Francisco, CA (US); Cheng-Gang Kong, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 421 days.

(21) Appl. No.: 11/523,139

(22) Filed: Sep. 19, 2006

(65) Prior Publication Data

US 2008/0068911 A1    Mar. 20, 2008

(51) Int. Cl.
*G06F 17/50* (2006.01)
(52) U.S. Cl. .................. 716/1; 716/2; 716/18
(58) Field of Classification Search .............. 716/1, 716/2, 18; 365/211
See application file for complete search history.

(56) References Cited

U.S. PATENT DOCUMENTS

| | | | | | |
|---|---|---|---|---|---|
| 5,949,778 | A | * | 9/1999 | Abu-Amara et al. | 370/388 |
| 5,953,318 | A | * | 9/1999 | Nattkemper et al. | 370/236 |
| 6,084,865 | A | * | 7/2000 | Dent | 370/321 |
| 6,108,394 | A | * | 8/2000 | Dilbeck | 377/67 |
| 6,631,503 | B2 | * | 10/2003 | Hsu et al. | 716/4 |
| 6,734,703 | B1 | * | 5/2004 | Alfke et al. | 326/38 |
| 6,819,157 | B2 | * | 11/2004 | Cao et al. | 327/262 |
| 7,024,326 | B2 | * | 4/2006 | Nygren | 702/89 |
| 7,222,036 | B1 | * | 5/2007 | Thorne | 702/79 |

* cited by examiner

*Primary Examiner*—Sun J Lin
(74) *Attorney, Agent, or Firm*—Suiter Swantz pc llo

(57) ABSTRACT

The present invention is a method for data path voltage and temperature compensation. The method includes configuring an offline data path to match an online data path. The method further includes compensating the offline data path for voltage and temperature variation. The method further includes swapping the offline data path with the online data path. Further, swapping occurs automatically without interruption of data flow along the data paths.

20 Claims, 22 Drawing Sheets

2000

Synchronizing a first write pointer and a second write pointer, the first write pointer being an offline write pointer, the second write pointer being an online write pointer — 2002

Swapping at least one bit from the first write pointer with at least one bit of the second write pointer when the bits are static — 2004

Regenerating a DQS clock — 2006

Allowing the first write pointer to sample data from the second write pointer for synchronizing the write pointers, the first write pointer being communicatively coupled with the second write pointer ⟶ 2102

Utilizing sampled data for determining when the bits are static ⟶ 2104

*FIG. 21*

SYSTEM AND METHOD FOR PROVIDING SWAP PATH VOLTAGE AND TEMPERATURE COMPENSATION

FIELD OF THE INVENTION

The present invention relates to the field of electronic data storage and particularly to a system and method for providing swap path voltage and temperature compensation.

BACKGROUND OF THE INVENTION

A read path of a RAM (Random-access Memory) device may require a delay to be added to a clock path to strobe data in the center of an eye pattern. The delay may be subject to process, voltage and temperature (PVT) variation, which may limit the speed of read operations. A method may be utilized for first removing process variation. Further updates may be applied to remove voltage variation and temperature variation. Current solutions may utilize a master delay cell to emulate a correct delay setting. The correct delay setting may then be applied to slave delay cells within the actual clock path. The master delay cell may then be monitored for voltage and temperature changes, corrected for said changes, and the slave delay cells updated with the new setting. However, the current solutions may introduce mapping errors due to on-chip process variation from the master to slave delays. Further, the current solutions may require that data flow be interrupted in order to update the slave delay cells. In addition, the currently implemented master-to-slave systems do not account for internal skew across multiple data paths which are strobed with a single clock. Still further, the currently implemented master-to-slave systems may have stringent duty cycle requirements. Also, current solutions may require custom-designed delay cells for reducing mapping error and may further require custom-designed overhead delay cells for accurately delaying data paths to match the clock path delay cell when the clock path delay cell is set to its minimum delay setting.

Therefore, it may be desirable to have a system and method for providing swap path voltage and temperature compensation which addresses the above-referenced problems and limitations of the current solutions.

A SDRAM (Synchronous Dynamic Random Access Memory) bi-directional data strobe (DQS-Data Strobe Signal) may require gating for removing unwanted write strobes and idle period noise from entering a read path of a memory controller. Without gating, false read strobes may corrupt read data. Further, latch up of data registers may occur if noise is not removed from DQS. With current solutions, DQS is gated (i.e., forced to zero) before and after read clock bursts by two methods. The first currently implemented method involves adjusting programmable delays within the memory controller to match round trip delay of clock to the SDRAM (CK) and DQS back from the SDRAM. Said programmable delays adjust gating logic on the DQS strobe so that only read burst transitions are received into the memory controller. The second currently implemented method involves gating the DQS before and after read clock bursts by utilizing a fixed feedback loop, external to the memory controller, with a delay that matches CK (controller to SDRAM) and DQS (SDRAM to controller). Further, the fixed feedback loop supplies a signal that gates the DQS read burst transitions. However current solutions have drawbacks in that, although the first method of gating DQS may remove process variation, it suffers from voltage and temperature variation after initial setup. Further, the second method, although it may track voltage and temperature variation, it does not remove process variation. Still further, when implementing the second method, it may be difficult to accurately determine correct trace length required on a circuit board, due to different loading of the memory controller compared to the SDRAM.

Therefore, it may be desirable to have a system and method for providing feedback path voltage and temperature compensation of programmable delay read data strobe gating which addresses the above-referenced problems and limitations of the current solutions.

A number of memory applications may require a continuous read clock. The continuous read clock may require a delay to center it within a data eye. However, the delay may suffer from voltage and temperature (VT) variation and may require adjusting while maintaining continuous memory reads. Current solutions may attempt to keep latency across a memory controller read path to a minimum. For instance, some current solutions may pass the read clock (DQS) via a delay cell to a memory controller, while a data path, once registered, is passed to the memory controller with zero cycle timing. This may allow a memory controller designer to take advantage of the minimized/short latency. In order to update for VT variation of the delay cell, and maintain a continuous read operation, a number of solutions are currently implemented. For example, a first current solution may not compensate a clock delay cell for VT variation, but may simply adjust the clock delay cell once after power on reset, with further VT variation being considered small enough to be ignored. A second current solution may include memory systems which provide an extra signal for indicating valid read data, with a delay cell being updated for VT variation when read data is not valid. A third current solution may provide a delay cell which may be designed so that it may be updated without output glitches occurring. With the third current solution, an offline master delay cell may be used to monitor VT variation, the VT variation being applied to an online slave delay cell in minimum increments so as not to introduce a large shift on a DQS clock. However, the current solutions suffer from drawbacks. For instance, the first current solution may only work for slow frequency applications and, after an initial setting of the clock delay cell, VT variation may cause data errors if the frequency is too high. The second current solution may require a fast update of the delay cell during non-valid data periods. Further, the second current solution may not allow for continuous read data, such as where the data is always valid or at least where the non-valid data periods are so short that a safe update would be impossible. The third current solution, with its master-slave approach, may lead to mapping errors due to PVT variation across a chip. Further, designing a glitch-free delay cell may be difficult and limited in its operating frequency. Moreover, most glitch-free designs may require control logic clocked from within a DQS domain. In addition, synchronization of control across a DQS/system clock boundary may add greatly to the complexity of the design.

Therefore, it may be desirable to have a system and method for providing asynchronous clock regeneration which addresses the above-referenced problems and limitations of the current solutions.

SUMMARY OF THE INVENTION

Accordingly, an embodiment of the present invention is directed to a method for data path voltage and temperature compensation. The method includes configuring an offline data path to match an online data path. The method further includes compensating the offline data path for voltage and temperature variation. The method further includes swapping the offline data path with the online data path. Further, swapping occurs automatically without interruption of data flow along the data paths.

An additional embodiment of the present invention is directed to a method for providing programmable delay read data strobe gating with voltage and temperature compensation including: receiving a training request; calibrating programmable delay lines for operating frequency and voltage and temperature variation; locking to a first feedback signal; storing a first feedback lock setting corresponding to the locked-to first feedback signal; granting the training request; and when training is completed, recalibrating the programmable delay lines for operating frequency and voltage and temperature variation.

An further embodiment of the present invention is directed to a method of asynchronous clock regeneration, including: synchronizing a first write pointer and a second write pointer, the first write pointer being an offline write pointer, the second write pointer being an online write pointer; swapping at least one bit from the first write pointer with at least one bit of the second write pointer when the bits are static; and regenerating a DQS (Data Strobe Signal) clock.

A current embodiment of the present invention is directed to a system for asynchronous clock regeneration, including: a first write pointer and a second writer pointer, the first write pointer being an offline write pointer, the second write pointer being an online write pointer, the first write pointer and the second write pointer configured for being communicatively coupled with each other; and a clock regeneration path communicatively coupled with the first and second write pointers, the clock regeneration path configured for regenerating a DQS (Data Strobe Signal) clock, wherein the system allows for at least one bit of the first write pointer to be swapped with at least one bit of the second write pointer when the bits are static, thereby allowing for swapping without interrupting data flow under at least one of burst DQS (Data Strobe Signal) and continuous DQS (Data Strobe Signal) conditions.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIGS. 20-22 illustrate a method for asynchronous clock regeneration in accordance with an exemplary embodiment of the present invention.

DETAILED DESCRIPTION OF THE INVENTION

Reference will now be made in detail to the presently preferred embodiments of the invention, examples of which are illustrated in the accompanying drawings.

Figure 1:
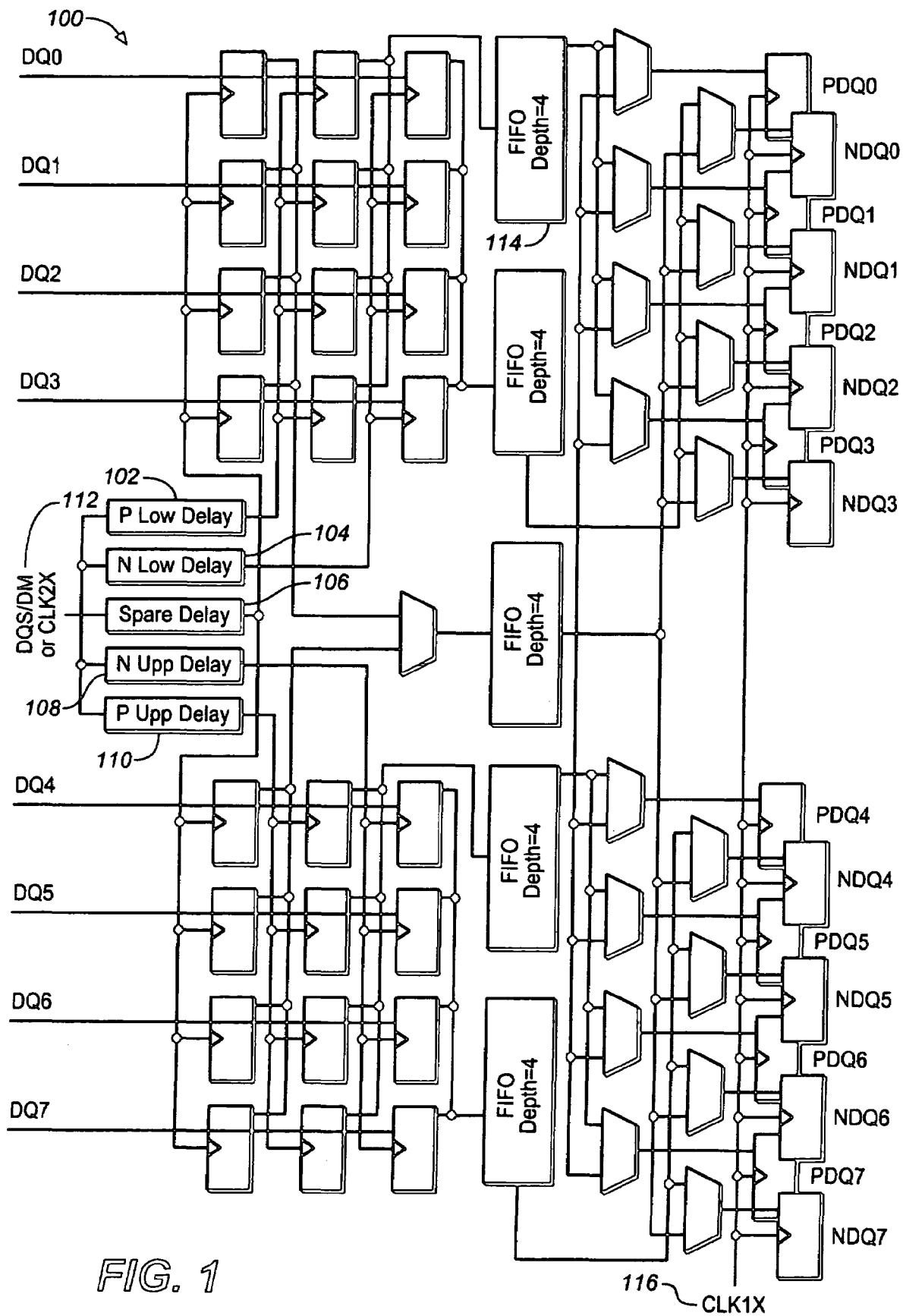
FIG. 1 illustrates swap path architecture of a state machine in accordance with an exemplary embodiment of the present invention.

FIG. 1 illustrates swap path architecture 100 of a state machine 500, such as a DP state machine, a RAM device or the like (see FIG. 5) in accordance with an exemplary embodiment of the present invention. In a present embodiment, the architecture 100 includes a read path having five clock and data paths 102, 104, 106, 108 and 110. In the exemplary embodiment, four of the paths (102, 104, 108 and 110) are configured for positive (p) and negative (n) edge clocking, upper (upp) and lower (low) nibble data. (Ex.—path names are p_low, n_low, p_upp, and n_upp). For instance, p_low and n_low may each be 4-bit lower nibble paths, while p_upp and n_upp may each be 5-bit upper nibble paths (8 bits for DDR (Double Data Rate) and 9 bits for QDR (Quad Data Rate)). Also included is a spare path 106 which may be configured to match any of the above-mentioned four paths (102, 104, 108 and 110) and be compensated for voltage and temperature (VT) change while the spare path 106 is offline and the other four paths (102, 104, 108 and 110) are online. Once the spare path 106 is matched and VT compensated, it may be swapped for one of the online paths (102, 104, 108 and 110), meaning that the VT compensated spare path may go online, while one of the previously online paths goes offline for VT compensation. The swap path architecture 100 of the present invention allows for one path (102, 104, 106, 108 or 110) to be offline, thereby allowing for VT compensation of the offline path without any interruption to read traffic.

In an exemplary embodiment, the state machine swap path architecture 100 further includes two data strobes/clocks, DQS_IN and DM_IN (112). DQS_IN may be implemented in embodiments using DDR×8 mode, while DQS_IN and DM_IN may be implemented in embodiments using DDR×4 mode. For instance, the data strobes 112 may be SDRAM (Synchronous Dynamic Random Access Memory) bidirectional read burst data strobes. In embodiments implementing QDR×9 mode, DQS_IN and DM_IN may be replaced by four input clocks, GATEON_UPP_FB_IN, GATEON_LOW_F-B_IN, QDR_CLKN_UPP_IN and QDR_CLKN_LOW_IN. These four input clocks may be configured so that QDR read data may be strobed from either corner of the swap path architecture 100. In further embodiments, a user may select either a single clock (for both rising and falling edge strobing) or two, one-hundred eighty degree phase-shifted clocks (for rising edge only strobing).

In a current embodiment, the swap path architecture 100 further includes a plurality of FIFOs (114) (First-In First-Out data buffers) for transferring data to a system clock domain 116 (CLK1X). For instance, five, nibble-wide, 4-bit-deep FIFOs may be utilized for swapping data paths of the five clock and data paths (102, 104, 106, 108, 110) online and offline. In embodiments where a user requires faster latency than may be achieved through the FIFOs (114), a direct data path may be provided, along with data strobes from the DQS_IN and/or DM_IN domain (112). In the present embodiment, each FIFO 114 includes a write pointer. The FIFOs (114) are connected to and are configured for swapping data paths (and thus data) of the five clock and data paths (102, 104, 106, 108 and 110) at outputs of the FIFOs via the FIFOs' write pointers. For instance, a FIFO 114 connected to an offline data path of the clock and data paths (102, 104, 106, 108 and 110) (i.e., "an offline FIFO") may include a write pointer (i.e., "an offline write pointer"), while a FIFO 114 connected to an online data path of the clock and data paths (102, 104, 106, 108 and 110) (i.e., "an online FIFO") may also include a write pointer (i.e., "an online write pointer"). First, the offline write pointer may be connected to the online write pointer, thereby allowing the offline write pointer to sample data of the online write pointer for the purpose of becoming synchronous with the online write pointer. Once the online and offline write pointers are synchronous, the state machine 500 may be configured to wait until the online and offline FIFOs have been read (i.e., all remnant data not contained within both the online and offline FIFOs is flushed out) and then may swap the offline data path with the online data path (i.e., the offline data path goes online, while the online data path goes offline for VT compensation and may be swapped back online once VT compensation is completed). In the exemplary embodiment, swapping of data paths for VT compensation occurs automatically, regardless of read data burst or continuous data and has no effect on output clocks or data (is glitch free, i.e.—occurs without interrupting read traffic). Further, no clocks are swapped, only data from the FIFOs (114) is swapped. In current embodiments, a user may provide read command status on an input pin, such as a DR_CMD_IN pin, to ensure correct VT compensation. Alternatively, if data strobes are continuous, a user may ensure proper VT compensation by tying the input pin, such as the DR_CMD_IN pin, high.

In embodiments where burst DQS clocks with large idle periods are implemented, write pointers of the FIFOs 114 may not become synchronous in time to track VT variation within an acceptable limit. In such embodiments, the state machine 500 may monitor read commands from a user (by monitoring DR_CMD_IN pin) and when a safe gap (gap long enough for FIFOs to be empty) is detected, the state machine 500 may asynchronously reset all write pointers and read pointers to zero and swap idle data paths. When no large idle gaps are detected, the state machine 500 may determine that sufficient DQS strobes have been present to synchronize write pointers, and may thus allow paths to be swapped safely without asynchronous reset.

In additional embodiments, a write path may be included with the swap path architecture 100. The write path may be 9 bits wide (9 bits for QDR and 8 bits for DDR). The write path may further implement DQS_OUT for write strobe and DM_OUT for data mask or ×4 data strobe. Write enables and I/O resets may be synchronized and controlled via the write path. Skew on data, write enable, clock and resets through the write path may be closely matched. Further, small adjustments may be selected for offsetting DQS_OUT and DM_OUT clock paths to more closely match system requirements. For example, DQS_OUT may be 90 degrees out of phase with data path DQ[8:0], but may be aligned for chip to chip applications. Still further, all clock dividers and reset synchronization may be supplied via the write path.

Figure 2:
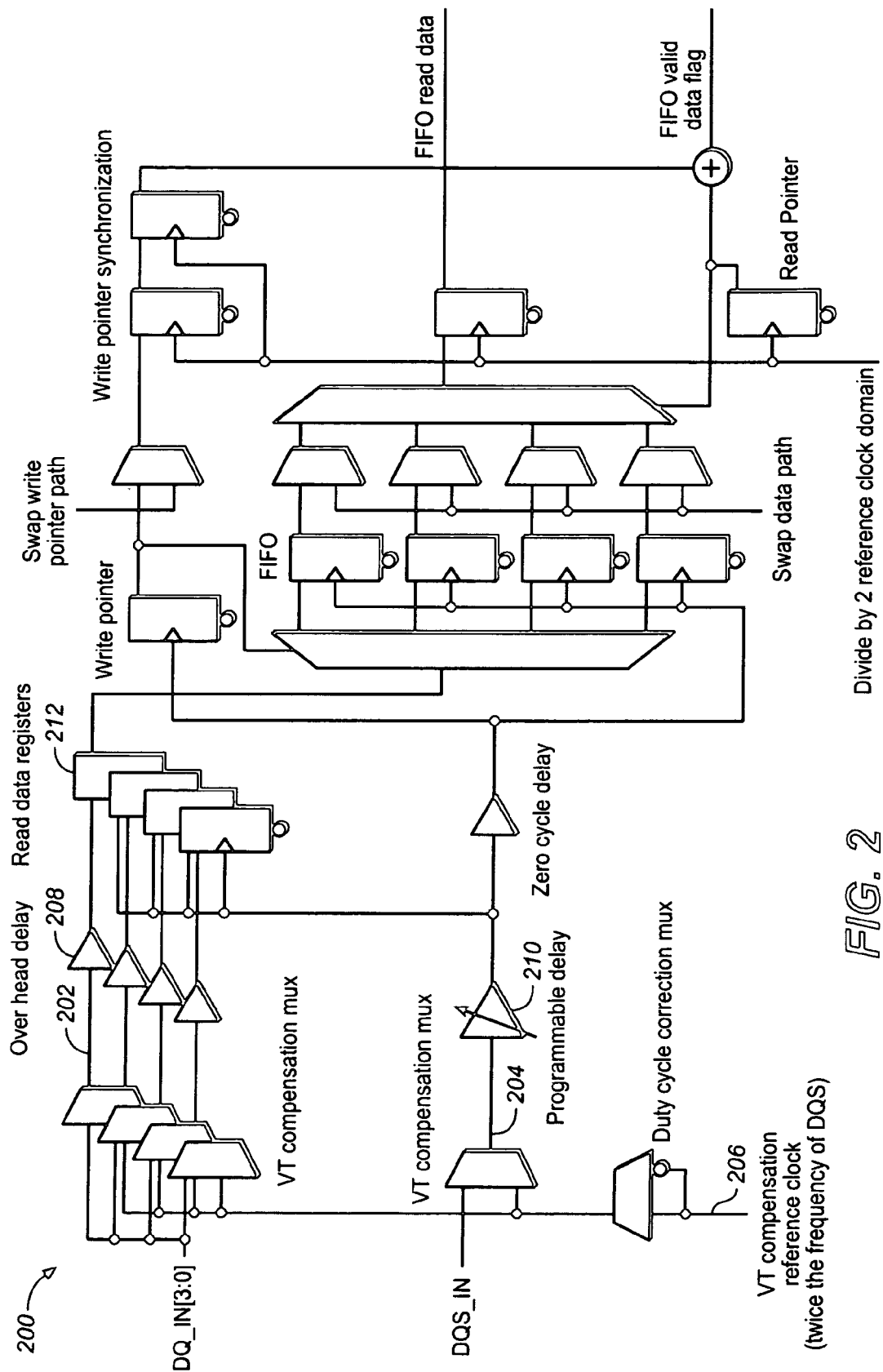
FIG. 2 illustrates a 4-bit portion of a read path in accordance with an exemplary embodiment of the present invention.

FIG. 2 illustrates a 4-bit portion of the read path discussed above and shown in FIG. 1 in accordance with an exemplary embodiment of the present invention. In the illustrated embodiment, the read path 200 includes a data path 202 and clock path 204 of one of the clock and data paths (102, 104, 106, 108, 110). The read path 200 further includes a reference clock of twice the frequency of DQS (206). When the data path 202 and clock path 204 of one of the clock and data paths (102, 104, 106, 108 and 110) are offline, the data path 202 may be VT compensated. During VT compensation, the reference clock 206 may be muxed (transmitted via multiplexer) into the offline data path 202 and the offline clock path 204. A clock path programmable delay 210 of the offline clock path may then be adjusted by the state machine 500, such as from a minimum delay setting, to determine a base delay setting. The base delay setting may be a value to which the clock path programmable delay 210 should be set to provide the best setup and hold margins at a plurality of read data registers 212 (in this example, 4 read data registers) of the offline data path 202. For example, the base delay setting may be the sum of aligned clock and data ("aligned delay") and ¼ cycle aligned clock and data ("¼ cycle delay") which provides best setup and hold margins at the read data registers 212. In the present embodiment, ¼ cycle delay may refer to half the reference clock (206) cycle, or DQS_IN delay required for centering the DQS_IN delay's edges within DQ_IN transitions.

The plurality of read data registers 212 of the offline data path 202 may be checked by steady state/stable state detection logic 300 (see FIG. 3) of state machine 500 for steady state conditions (all stable zeros or all stable ones detected). For example, a number of adjustments may be made for removing false positive results and centering clock to within the middle of setup and hold characteristics of the plurality of read data registers 212, such as four read data registers. The steady state conditions may be used by the state machine 500 to determine the base delay setting. Once found, the base delay setting is the initial and/or newly VT adjusted setting of the clock path programmable delay 210 of the offline clock path 204.

An overhead delay 208 may be included within the data path 202 for ensuring that the data path 202 is longer than the clock path 204 when the clock path programmable delay 210 is set to a minimum delay setting.

In a current embodiment, the swap path architecture 100 of the state machine 500 includes a plurality of the clock path programmable delays 210 as described above, for instance, the clock path 204 of each of the clock and data paths (102, 104, 106, 108 and 110) may include one of the clock path programmable delays 210 (P LOW DELAY, N LOW DELAY, SPARE DELAY, N UPP DELAY and P UPP DELAY, as shown in FIG. 1). The state machine 500 may sequentially perform VT compensation on each of the clock and data paths (102, 104, 106, 108 and 110) by adjusting settings of the clock path programmable delays 210 of the clock path 204 for each clock and data path (102, 104, 106, 108 and 110) to find VT compensated base delay settings for each clock and data path (102, 104, 106, 108 and 110) which provide for best setup and hold margins at data registers of a connected data path 202, as measured within the state machine's core. Once VT compensated, the offline clock and data path (102, 104, 106, 108 or 110) may be swapped online, so that a previously online clock and data path may go offline and be VT compensated, in a similar manner as described above. A typical swap sequence for the clock and data paths (102, 104, 106, 108 and 110) shown in FIG. 1 may be as follows:

spare to p_upp, p_upp to spare
spare to n_upp, n_upp to spare
spare to p_low, p_low to spare
spare to n_low, n_low to spare For instance, the offline spare path 106 may be configured to match the online p_upp path 110, the offline spare path 106 may be VT compensated, and the offline spare path 106 may then be swapped with the online p_upp path 110. The newly offline p_upp path 110 may then be VT compensated and swapped with the newly offline spare path (spare path goes back offline, p_upp path goes back online). The sequence may then proceed from there with the spare path 106 following a swap sequence with the remaining online paths (n_upp, p_low and n_low) as described above.

In additional embodiments, when the state machine 500 has determined the base delay settings for each of the four online clock and data paths (102, 104, 108 and 110), the state machine 500 may be configured for allowing a user to eye train the read path by applying offsets (ex: user-determined offsets) to optimize the swap path architecture 100 for external system skew. In embodiments where eye training is allowed, the state machine 500 receives an eye train request from the user. The state machine 500 may then complete its current cycle of VT compensation (i.e., determining base delay settings for each of the four online clock and data paths (102, 104, 108 and 110)) and then halt further operation. The state machine 500 may grant/allow the eye train request (ex.—by signaling the user that eye training may begin), with p_upp, n_upp, p_low and n_low online and the spare path offline. The user may then apply the offsets to the base delay settings of each of the four online paths (102, 104, 108 and 110). The user may then monitor read commands for good or failing results to determine the best offsets, and when the best offsets are determined and received via user input to the state machine 500, the user may negate the eye training request. The state machine 500 may be further configured to utilize the base delay settings for converting the offsets to ratios of ¼ cycle delay over offset (¼ cycle delay ^ offset) and storing the ratios by overwriting the offsets. When offset-to-ratio conversions are complete, the state machine 500 may be further configured for re-commencing offline VT compensation on each of the clock and data paths (102, 104, 106, 108 and 110) to determine updated base delay settings for the paths. The state machine 500 may be further configured for utilizing the updated base delay settings for determining updated ¼ cycle delay values and dividing the updated ¼ cycle delay values by their previously stored corresponding ratios, thereby creating VT compensated offsets. The VT compensated offsets may then be applied to the updated base delay settings for providing adjusted delay settings for each of the online clock and data paths (102, 104, 108 and 110). In an alternative embodiment, the ratios may be pre-determined and written to the state machine 500 by a user in lieu of eye training.

In further embodiments, bidirectional read burst data strobes may be gated by one of four methods: programmable gateon (i.e., programmable delay read data strobe gating); feedback gateon; programmable gateon (i.e., programmable delay read data strobe gating) with VT compensation; and external gateon. In exemplary embodiments, On Die Termination (ODT) may be controlled via the read path. For power saving during none read periods, the state machine 500 will de-select ODT. On reception of a read command, the state machine will power on ODT in time for the read burst.

Figure 3:
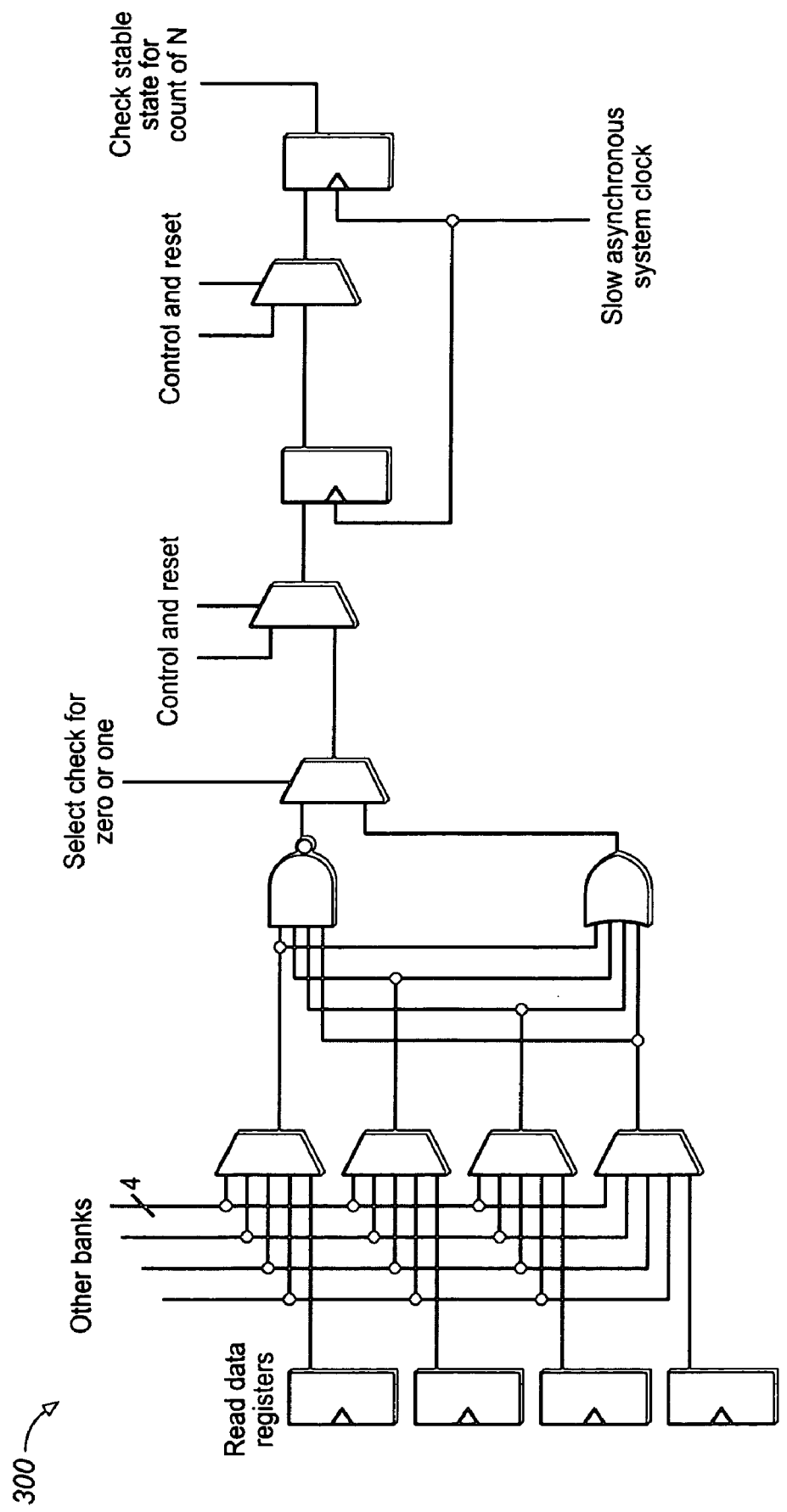
FIG. 3 illustrates stable state detection logic for connecting with offline read data registers of a read path in accordance with an exemplary embodiment of the invention.

FIG. 3 illustrates stable state detection logic 300 for connecting with offline read data registers 212 (see FIG. 2) of the read path 200 in accordance with an exemplary embodiment of the invention. In a current embodiment, only positive results (all zeros or all ones detected) are used. The positive results may be sampled for several clock cycles to minimize effects of clock jitter. In a further embodiment, both setup stable state and hold stable state may be calculated/determined, with a mid point setting saved as a best result for minimizing data path skew and none balanced (setup/hold) register characteristics.

Figure 4:
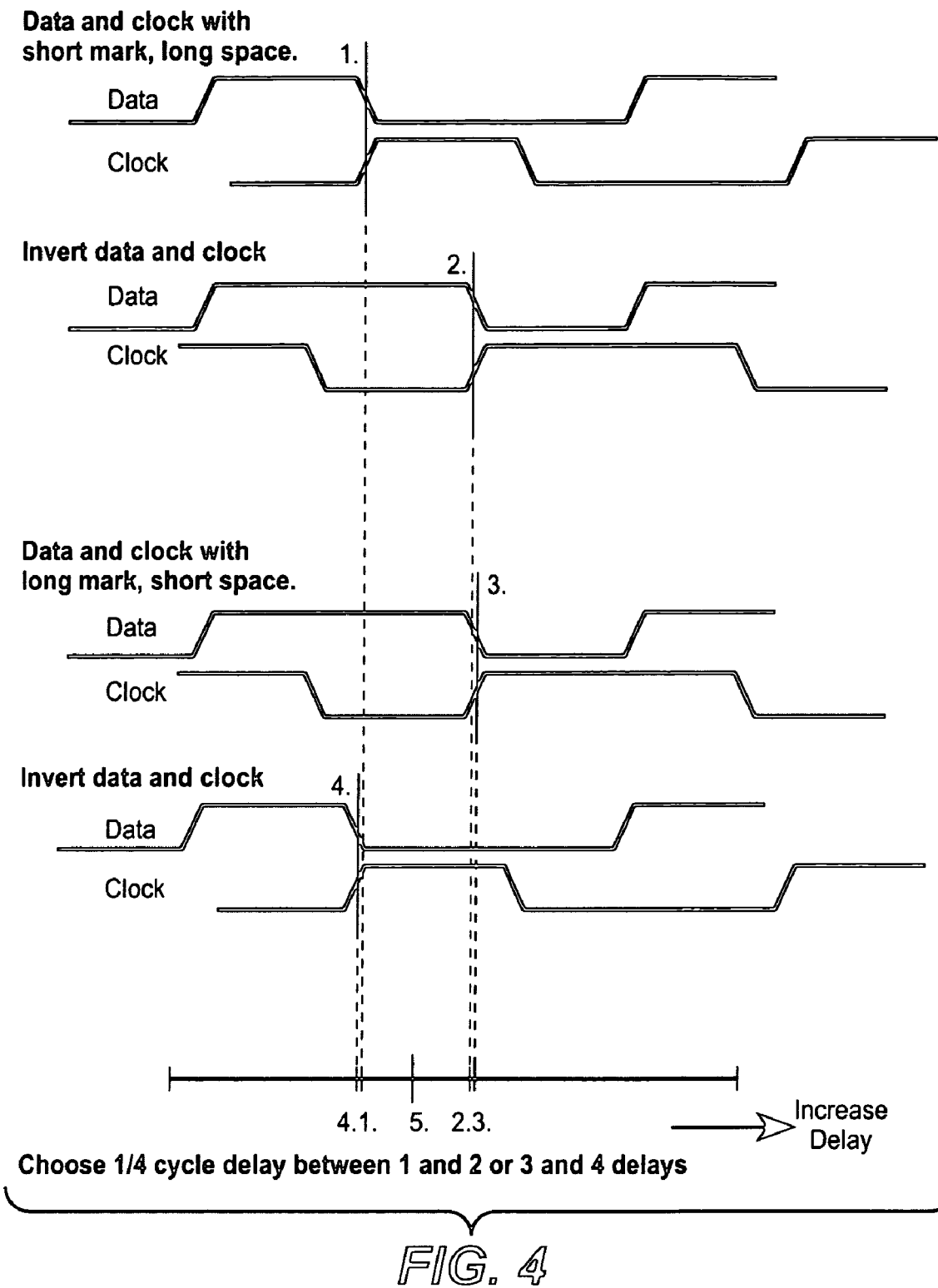
FIG. 4 illustrates how duty cycle distortion of a reference clock may be reduced from the ¼ cycle delay calculation.

FIG. 4 illustrates how duty cycle distortion of the reference clock 206 may be reduced from the ¼ cycle delay calculation. In a current embodiment, two passes may be run on the offline read path 200 for reducing duty cycle distortion. During the second of the two passes the reference clock 206 to both the clock paths 204 and data paths 206 may be inverted. Duty cycle distortion, with either short or long mark, may be reduced by selecting a central delay setting (5) between 1 and 2, or 3 and 4. The state machine 500 is configured for determining optimal clock path programmable delay settings (clock path programmable delay settings so that data eye will be sampled within same margin for setup and hold from an internal state machine perspective.

Figure 5:
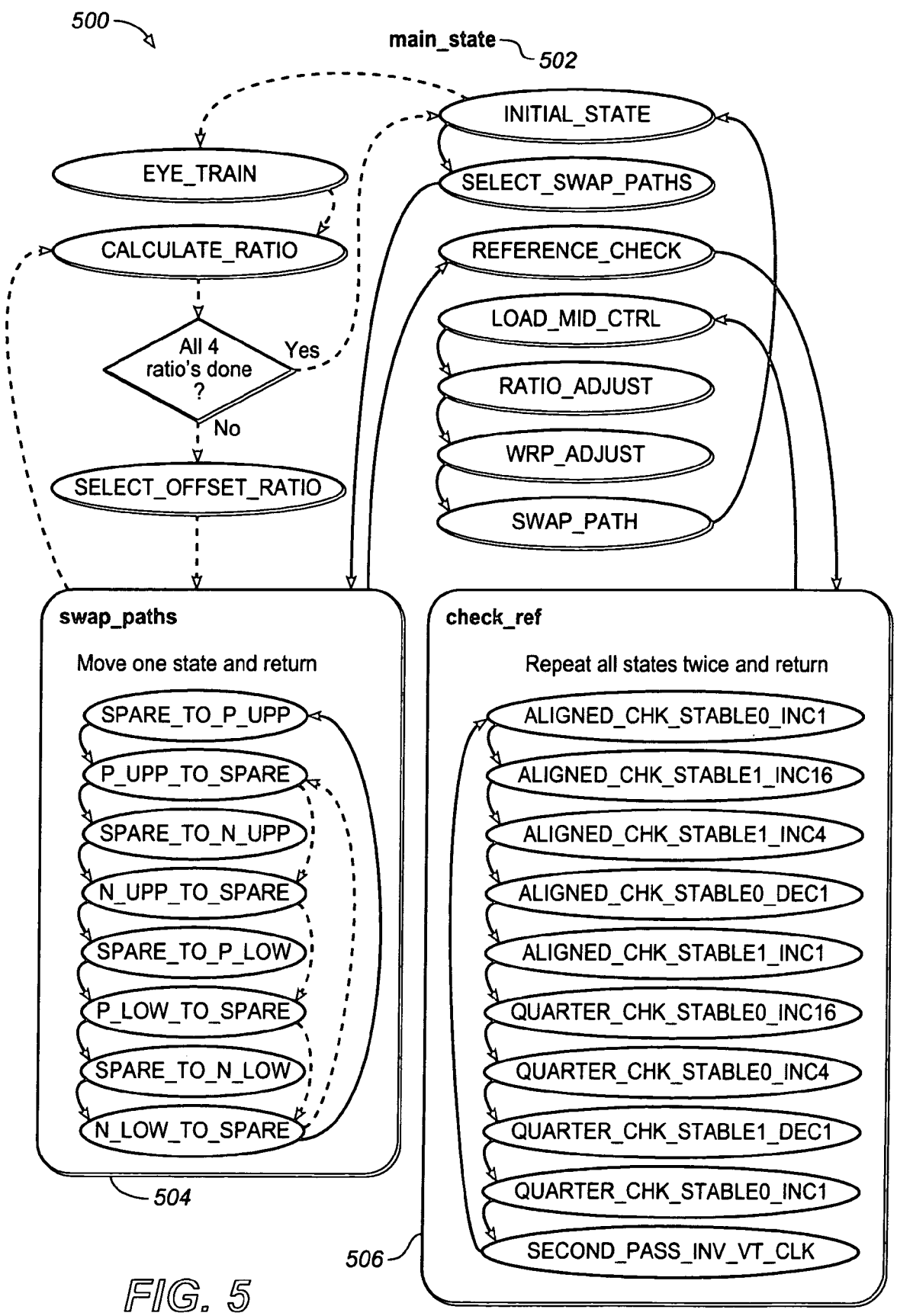
FIG. 5 illustrates a state machine in accordance with an exemplary embodiment of the present invention.

FIG. 5 illustrates the state machine 500 in accordance with an exemplary embodiment of the present invention. The state machine 500 is configured for performing VT compensation for the swap path architecture 100 previously discussed. The state machine 500 includes first, second and third branch state machines: main_state (502), swap_paths (504), and check_ref (506) respectively. The first branch state machine 502 calls or directs activities of the other branch state machines (504, 506). The second branch state machine (504) is communicatively coupled with the first branch state machine (502), and is configured for recording which paths (102-110) are online or offline. The third branch state machine (506) is communicatively coupled with the first branch state machine (502), is configured for checking an offline path (one of 102, 104, 106, 108 or 110) against the reference clock 206 and for compensating the offline path for VT variation. The state machine 500 is further configured for converting user offsets to ratios of ¼ cycle delay over user offset. The state machine 500 is further configured for using the ratios to re-create VT compensated offsets during subsequent passes of the state machine. The state machine 500 is configured for compensating an offline path (one of 102-110) for VT variation without interruption of read traffic.

In an exemplary embodiment, the main_state branch state machine 502 includes a number of states (shown in FIG. 5), which may follow the sequence as set forth in FIG. 5, during which various functions of the state machine 500 may be performed, such as: INITIAL_STATE; EYE_TRAIN; SELECT_SWAP_PATHS; REFERENCE_CHECK; LOAD_MID_CTRL; RATIO_ADJUST; WRP_ADJUST; SWAP_PATH; CALCULATE_RATIO; and SELECT_OFFSET_RATIO. In the exemplary embodiment, INITIAL_STATE is a reset state. The EYE_TRAIN state allows for user eye training or gateon training when initial voltage and temperature settings have been determined for the four online clock and data paths (p_upp, n_upp, p_low and n_low). During EYE_TRAIN, the spare path (106) is offline since the spare path is not used for eye training, but the spare path (106) may be matched to any user eye training via the ratio of ¼ cycle delay ^ user offset. SELECT_SWAP_PATHS is a state utilized during normal operation of the main_state branch state machine 502 for selecting which paths (102, 104, 106, 108, 110) may be swapped on/offline for VT compensation.

The REFERENCE_CHECK state may be utilized for performing VT compensation on the offline path. The LOAD_MID_CTRL state may be utilized for loading a control number (ex.—base delay setting) within a control register of a clock path programmable delay, the control number being a number midway between minimum steady state hold and minimum steady state setup numbers determined by the REFERENCE_CHECK state. The RATIO_ADJUST state may be utilized to adjust the control number by an offset calculated during the CALCULATE_RATIO state (ex.—(¼ cycle*16)/ratio) with the offset sign having been stored previously during the CALCULATE_RATIO state.

During WRP_ADJUST, offline and online write pointers of the FIFOs 114 may be synchronized as discussed previously, including having the offline write pointer clock phase shifted (via clock path programmable delay 210) to match (with minor change for VT) the online write pointer clock, thereby allowing for sampling. In current embodiments, when no DQS clocks are available for synchronization (i.e., there's been no read command activity to produce DQS clock edges), the offline and online write pointers may be asynchronously reset by the state machine 500.

During SWAP_PATH, the offline FIFO (112) write pointer (including data, data paths) may be swapped with the online FIFO (112) write pointer (including data, data paths) in the system clock domain 116 (CLK1X). In a current embodiment, the write pointers may be Gray coded and configured for swapping one bit at a time, preferably, after the bits have just toggled. In alternative embodiments, the write pointers may be configured for reconstructing DQS clock signals, and may allow for glitch free clock swapping (such as by xoring the on and offline write pointers and xoring an early and late version of the clock signal). During asynchronous reset of the write pointers, the reconstructed DQS clock may be held in a low state to suppress additional pulses. During CALCULATE_RATIO, user offsets are converted to ratios and stored as discussed above, with this state then no longer being used during normal (ex.—non eye-training) operations of the state machine 500. SELECT_RATIO may be used in conjunction with CALCULATE_RATIO for tracking which ratio (for which online path) is being calculated.

The swap_paths branch state machine 504 includes the following states: SPARE_TO_P_UPP; P_UPP_TO_SPARE; SPARE_TO_N_UPP; N_UPP_TO_SPARE; SPARE_TO_P_LOW; P_LOW_TO_SPARE; SPARE_TO_N_LOW; and N_LOW_TO_SPARE as shown in FIG. 5. The swap_paths branch state machine 504 tracks which paths are on/offline and which path is undergoing online VT compensation, the state of the swap_paths branch state machine 504 reflecting which path is undergoing such VT compensation at that time.

The check_ref branch state machine 506 checks the offline path (one of 102-110) against the reference clock and provides VT compensation. The check_ref branch state machine 506 further includes the following states as shown in FIG. 5:
ALIGNED_CHK_STABLE0_INC1;
ALIGNED_CHK_STABLE1_INC16;
ALIGNED_CHK_STABLE1_INC4;
ALIGNED_CHK_STABLE0_DEC1;
ALIGNED_CHK_STABLE1_INC1;
QUARTER_CHK_STABLE0_INC16;
QUARTER_CHK_STABLE0_INC4;
QUARTER_CHK_STABLE1_DEC1;
QUARTER_CHK_STABLE0_INC1; SECOND_PASS_INV_VT_CLK.

In an exemplary embodiment, during VT compensation, a stable state is declared if the data registers 212 show the same value for 31 CLK1X edges, after being in an unstable state and the clock path programmable delay 210 has been adjusted by one fine delay element. Control numbers stored during stable states determine minimum setup/hold margins for aligned clock and data and ¼ cycle adjusted clock and data. In a current embodiment, the check_ref branch state machine 506 only performs a state change when all zeros or all ones are detected from the 5 upper data bits or 4 lower data bits.

During ALIGNED_CHK_STABLE0_INC1, the data registers 212 are checked for all zeros while the reference clock 206 is injected into the offline data path 202 and offline clock path 204. In a present embodiment, the clock path programmable delay 210 is initially set at 0, and if all zeros are detected, the check_ref branch state machine 506 moves to the next state, if not all zeros, the clock path programmable delay 210 control number is incremented by 1. It is to be noted that overhead compensation delay should always be greater than the minimum clock path programmable delay setting+data register hold+jitter+cross talk+noise. During ALIGNED_CHK_STABLE1_INC16, if cross talk produces a positive result during ALIGNED_CHK_STABLE0_INC1, the clock path programmable delay 210 is jumped 16 fine elements to remove the chance of a false stable one detection. During ALIGNED_CHK_STABLE1_INC4, positive data pulses are found by incrementing 4 delay at a time until stable ones are detected. Incrementing by 4 may speed up the detection process.

During ALIGNED_CHK_STABLE0_DEC1, when data is all zeros, aligned hold number is stored and the state machine 500 proceeds to the next state, otherwise the state machine 500 decrements by 1. During ALIGNED_CHK_STABLE1_INC1, when data is all ones, aligned setup number is stored and the state machine 500 proceeds to the next state, otherwise the state machine 500 increments delay control. During QUARTER_CHK_STABLE0_INC16, aligned control ((hold+(setup−hold)/2)) is stored, the clock path programmable delay 210 is jumped 16 delays to get out of cross talk effected delay area. During QUARTER_CHK_STABLE0_INC4, negative data pulses may be found by incrementing 4 delay at a time until stable zeros are detected. Incrementing by 4 may speed up the detection process.

During QUARTER_CHK_STABLE1_DEC1, when data is all ones on a first pass, the state machine 500 stores ¼ cycle hold number and proceeds to the next state. Otherwise, the state machine 500 decrements delay control. During QUARTER_CHK_STABLE0_INC1, when it's first pass, the state machine 500 proceeds to the next state. When it's a second pass and data is all zeros, the state machine 500 stores ¼ cycle setup number and proceeds to the next state. Otherwise, the state machine 500 increments delay control. During SECOND_PASS_INV_VT_CLK, when it's a first pass, the reference clock 206 is inverted and a second pass is begun. Otherwise, the state machine 500 proceeds to the LOAD_MID_CTRL state of the main_state branch state machine 502 to store ¼ cycle control number ((hold+(setup−hold)/2). In the exemplary embodiment, two passes are run, with only relevant data being saved. In further embodiments, when VT compensation is being performed on n_upp or n_low (i.e., clock path is inverted), the term "all zeros" as used during the states of the check_ref branch state machine 506 described above may be substituted for the term "all ones".

Figure 14:
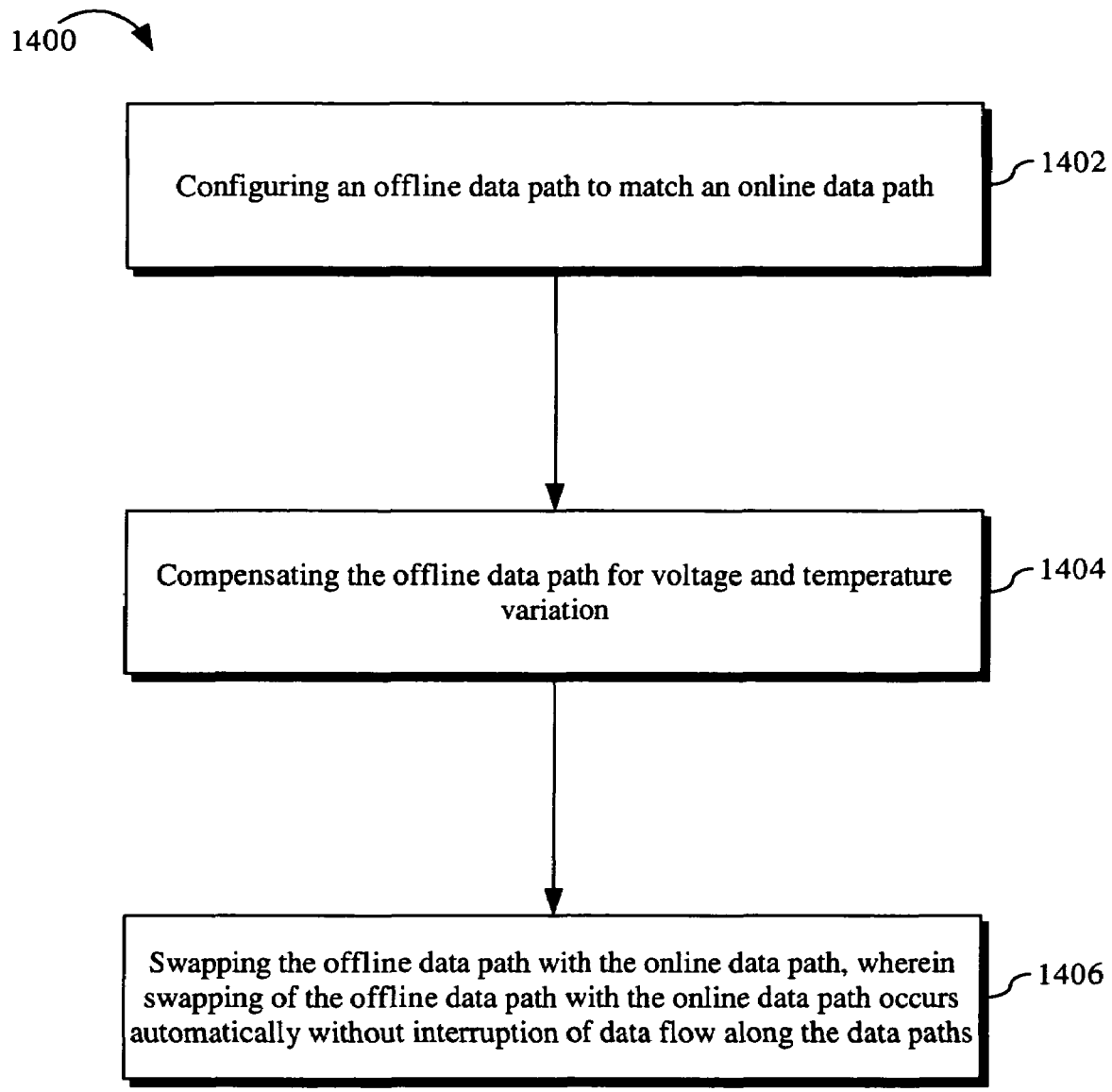
FIGS. 14-16 illustrate a method for data path voltage and temperature compensation in accordance with an exemplary embodiment of the present invention.
Figure 15:
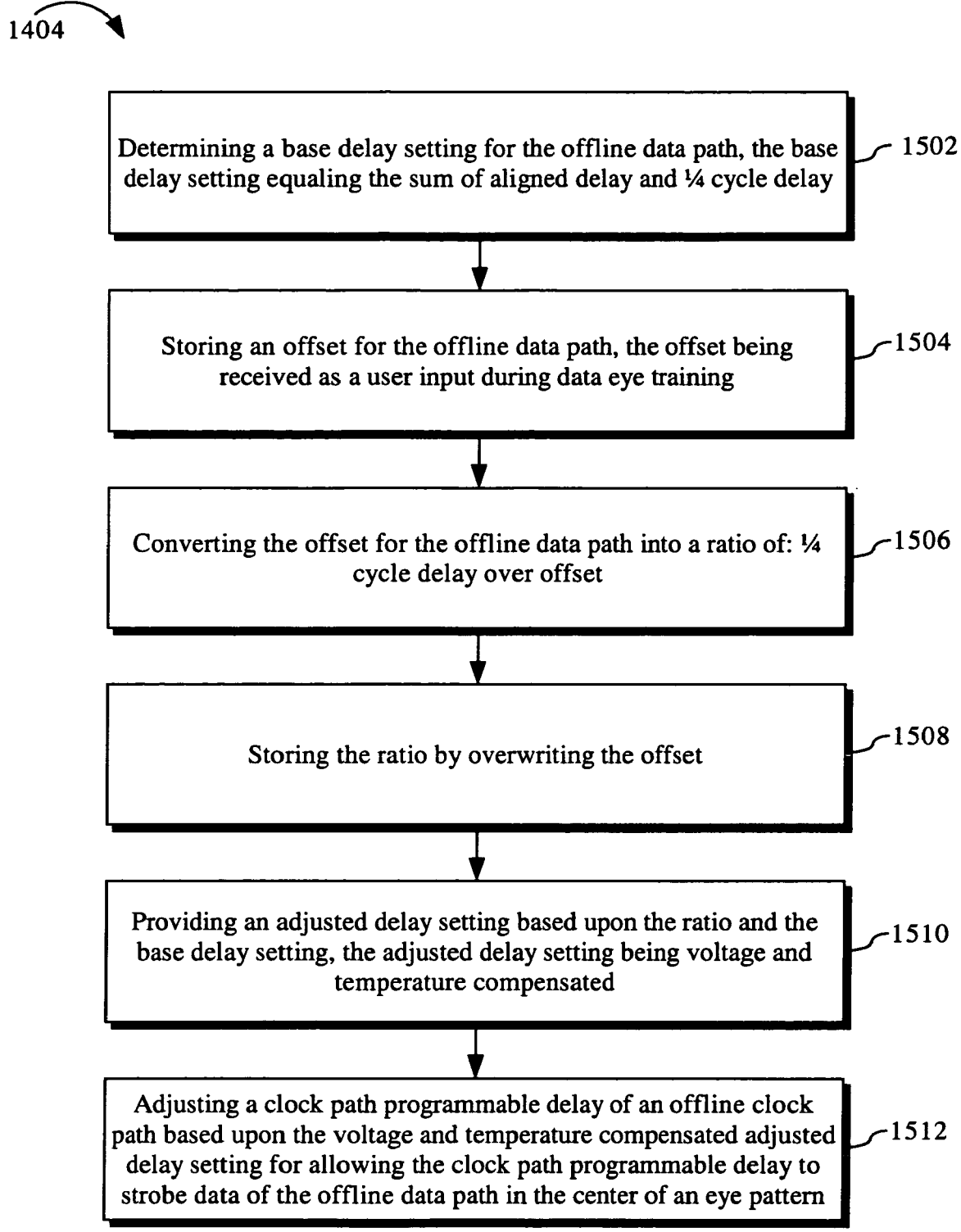
Figure 16:
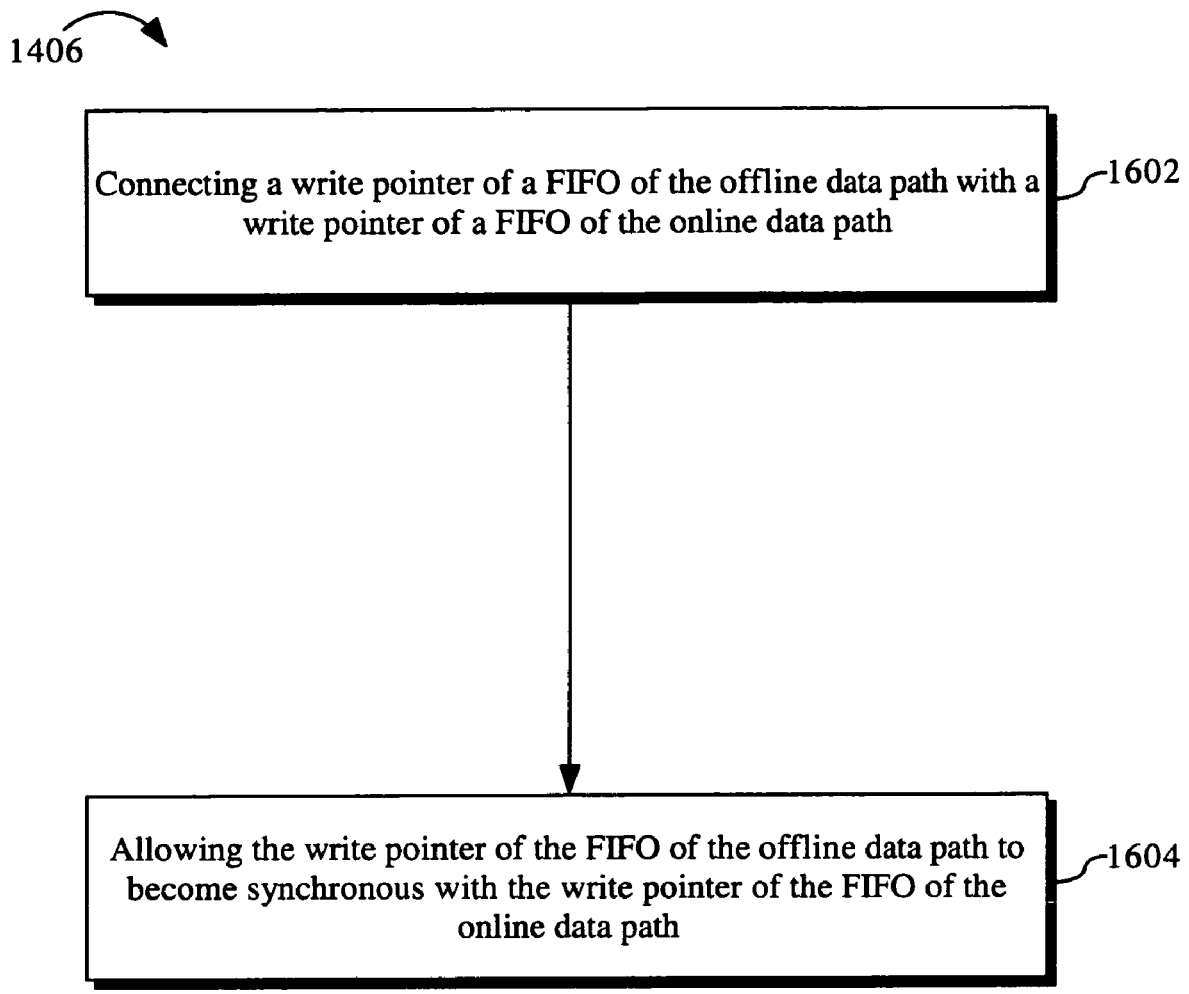

Referring generally to FIGS. 14-16, a method for data path voltage and temperature compensation is shown. The method 1400 includes the step of configuring an offline data path to match an online data path 1402. The method 1400 further includes the step of compensating the offline data path for voltage and temperature variation 1404. The method 1400 further includes the step of swapping the offline data path with the online data path 1406. In an exemplary embodiment, swapping of the offline data path with the online data path occurs automatically without interruption of data flow along the data paths.

In a present embodiment, the step of compensating an offline data path for voltage and temperature variation 1404 includes determining a base delay setting for the offline data path, the base delay setting equaling the sum of aligned delay and ¼ cycle delay 1502. The step of compensating an offline data path for voltage and temperature variation 1404 further includes storing an offset for the online data path, the offset being received as a user input during data eye training 1504. The step of compensating an offline data path for voltage and temperature variation 1404 further includes converting the offset for the online data path into a ratio of: ¼ cycle delay over offset 1506. The step of compensating an offline data path for voltage and temperature variation 1404 further includes storing the ratio by overwriting the offset 1508. The step of compensating an offline data path for voltage and temperature variation 1404 further includes providing an adjusted delay setting based upon the ratio and ¼ cycle delay, the adjusted delay setting being voltage and temperature compensated 1510. The step of compensating an offline data path for voltage and temperature variation 1404 further includes adjusting a clock path programmable delay of an offline clock path based upon the voltage and temperature compensated adjusted delay setting for allowing the clock path programmable delay to strobe data of the offline data path in the center of an eye pattern 1512.

In an exemplary embodiment, the step of swapping the offline data path with the online data path 1406 includes connecting a write pointer of a FIFO of the offline data path with a write pointer of a FIFO of the online data path 1602. The step of swapping the offline data path with the online data path 1406 further includes allowing the write pointer of the FIFO of the offline data path to become synchronous with the write pointer of the FIFO of the online data path 1604. In a present embodiment, swapping of the offline data path with the online data path 1406 occurs at outputs of the offline data path FIFO and the online data path FIFO. In a further embodiment, swapping of the offline data path with the online data path 1406 occurs when the offline data path FIFO and the online data path FIFO have been read.

Figure 6:
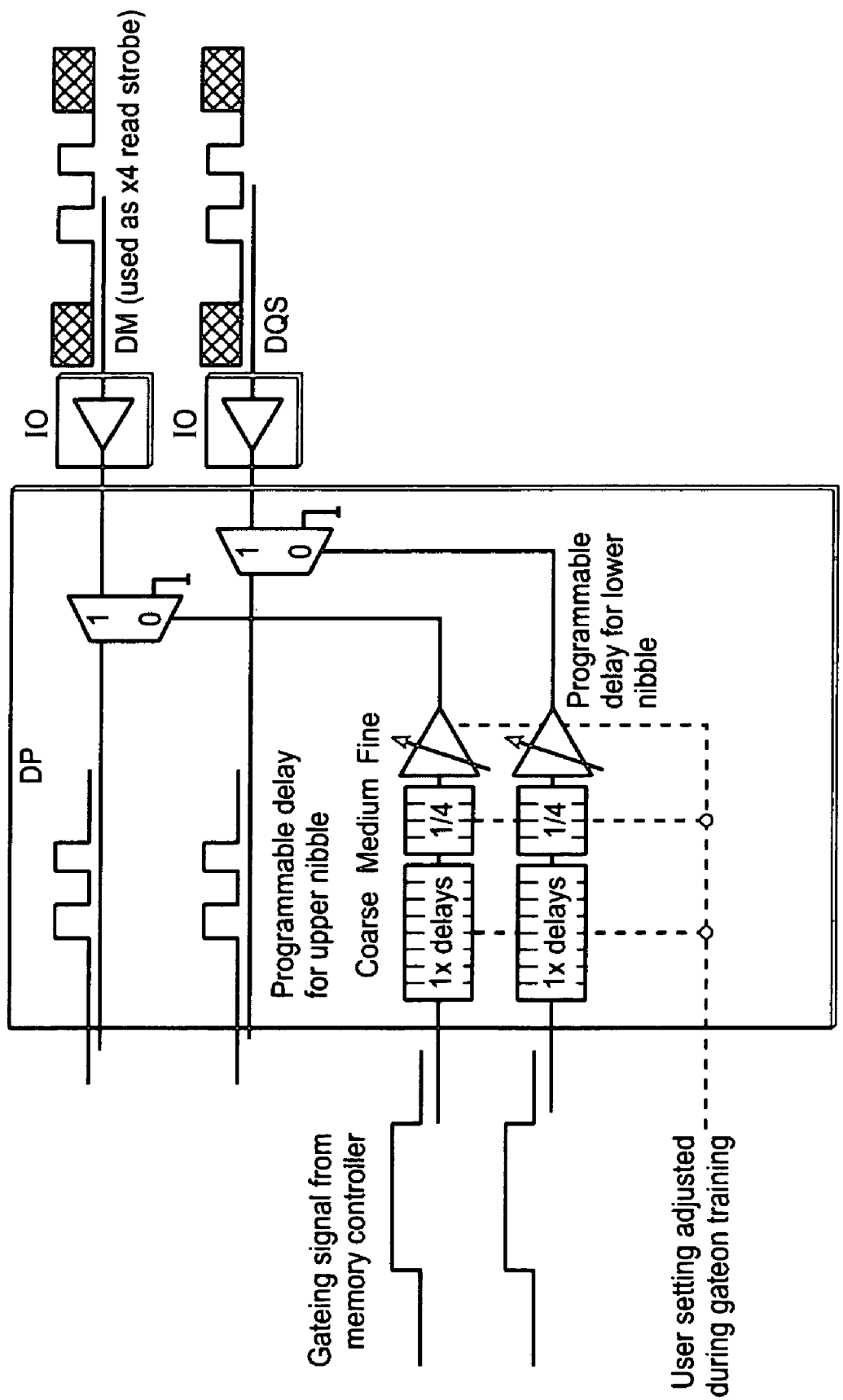
FIGS. 6 and 7 illustrate prior art embodiments of systems for gating bi-directional data strobes.
Figure 7:
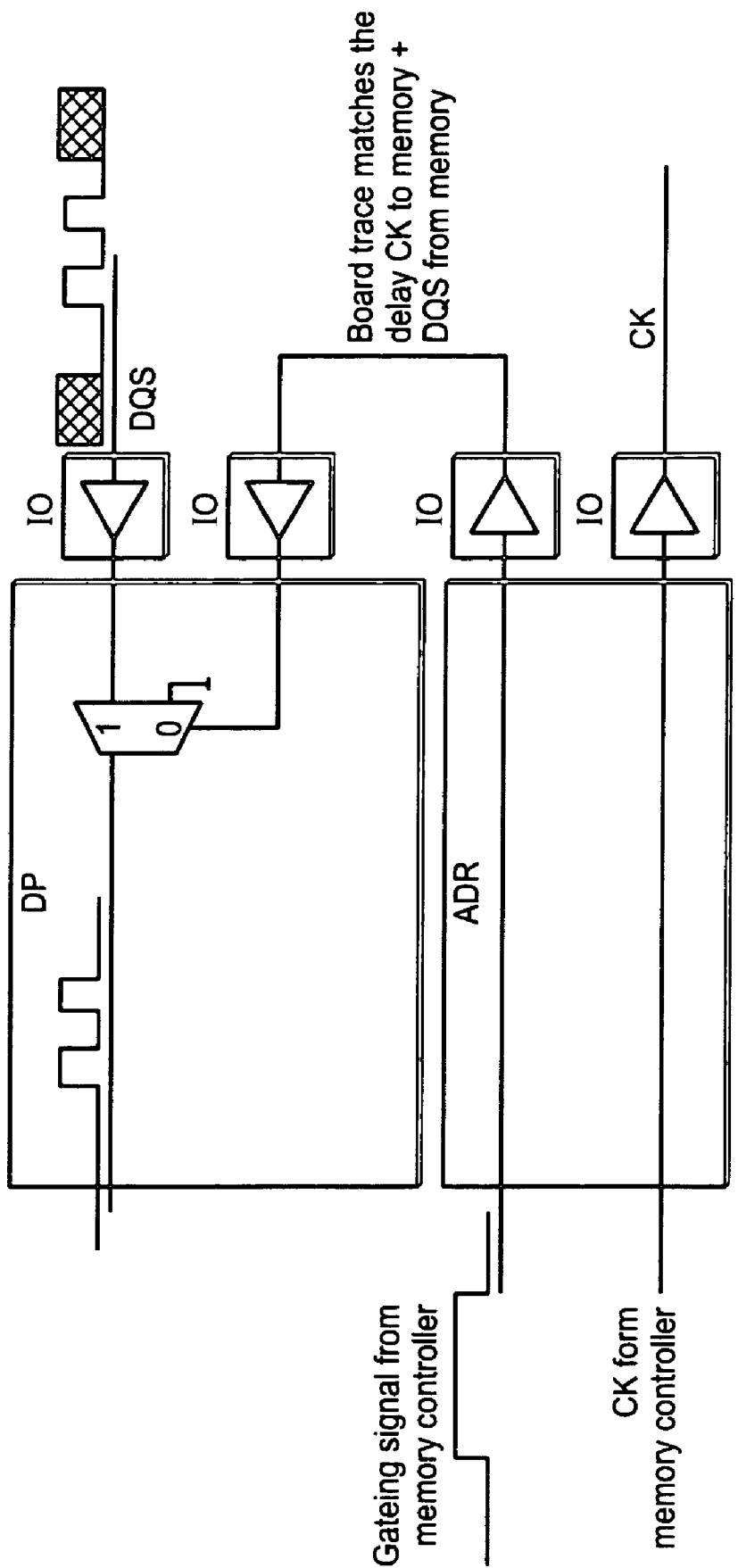
Figure 8:
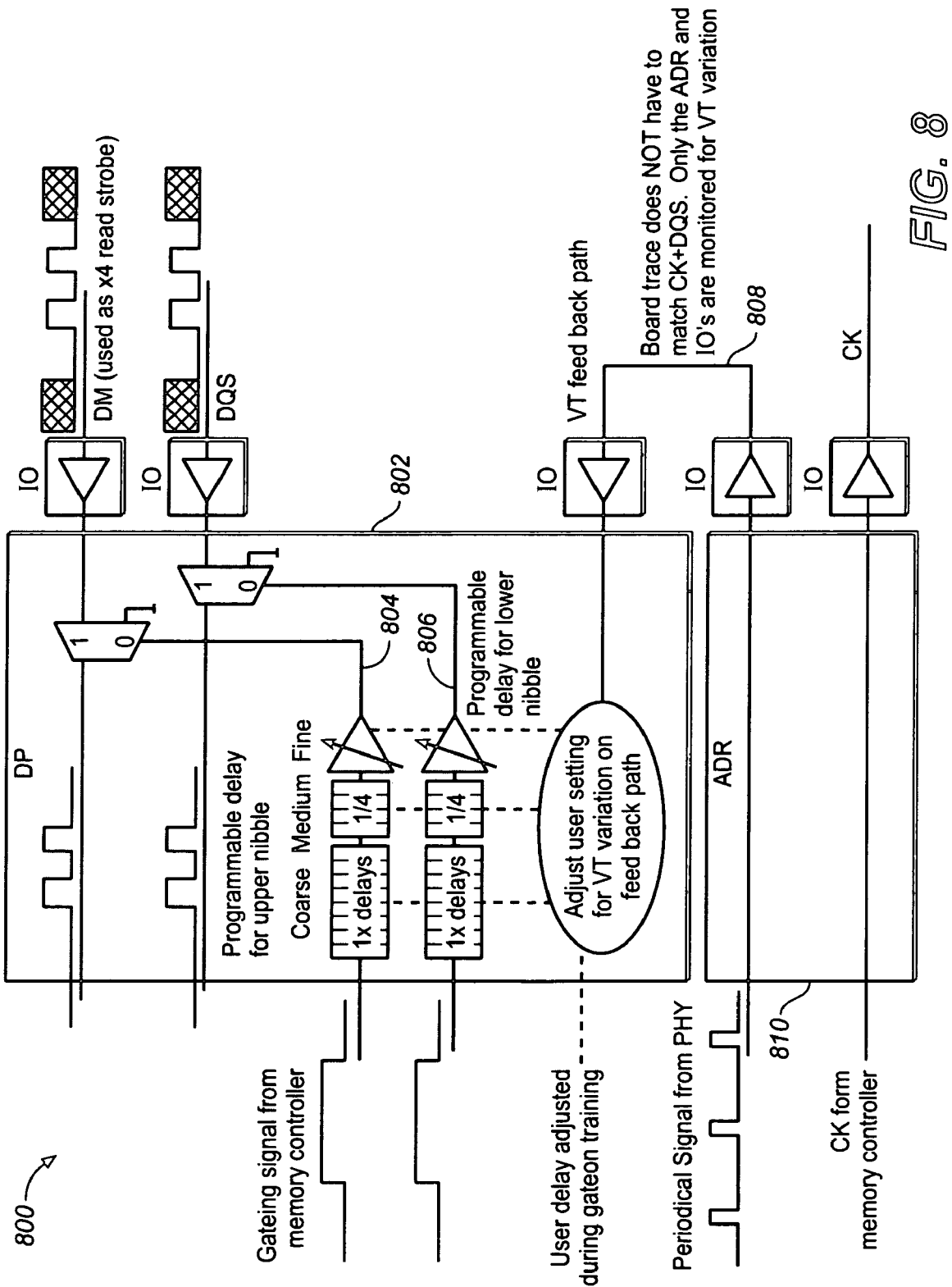
FIGS. 8-11 illustrate a system for providing programmable delay read data strobe gating with voltage and temperature (VT) compensation in accordance with exemplary embodiments of the present invention.
Figure 9:
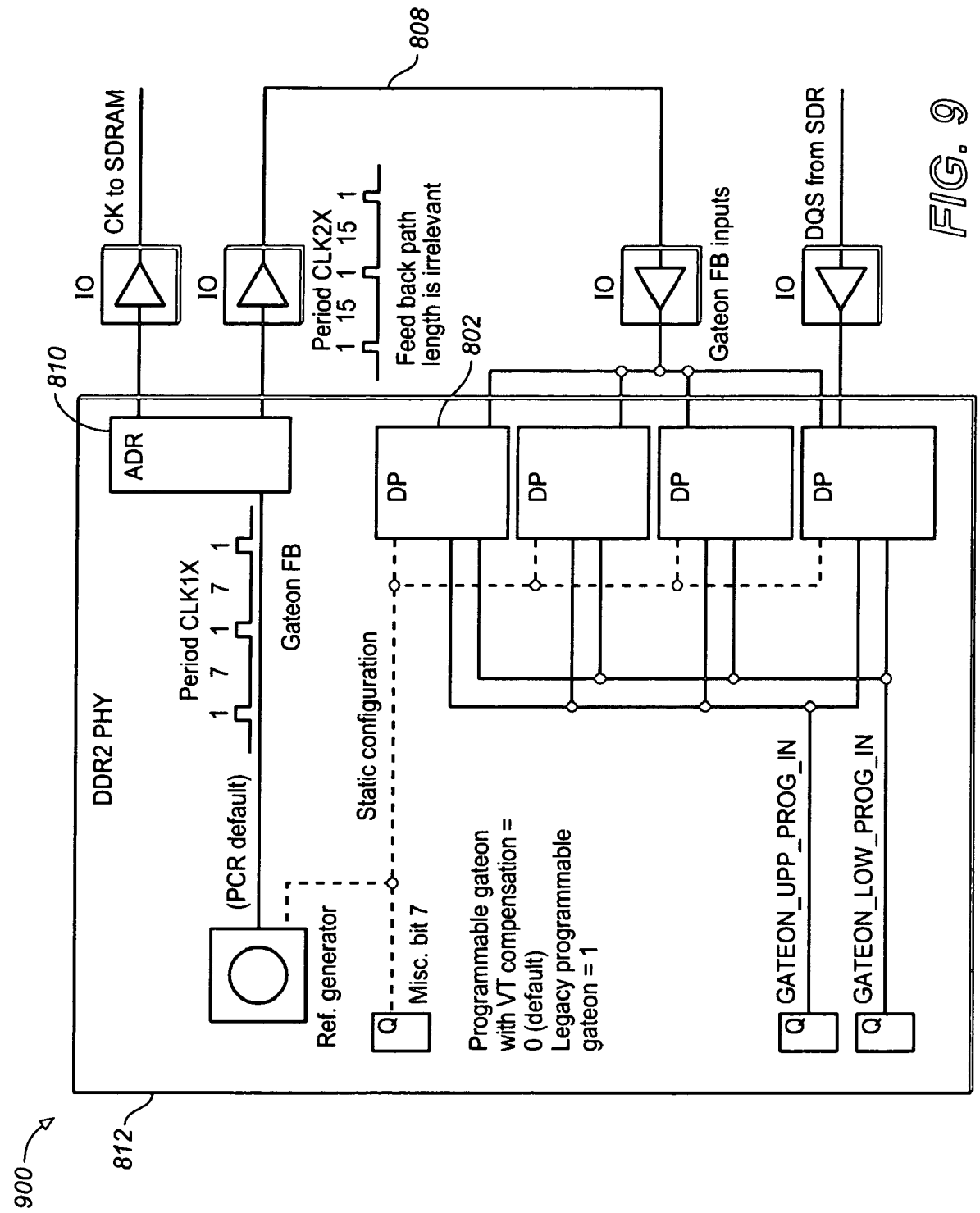
Figure 10:
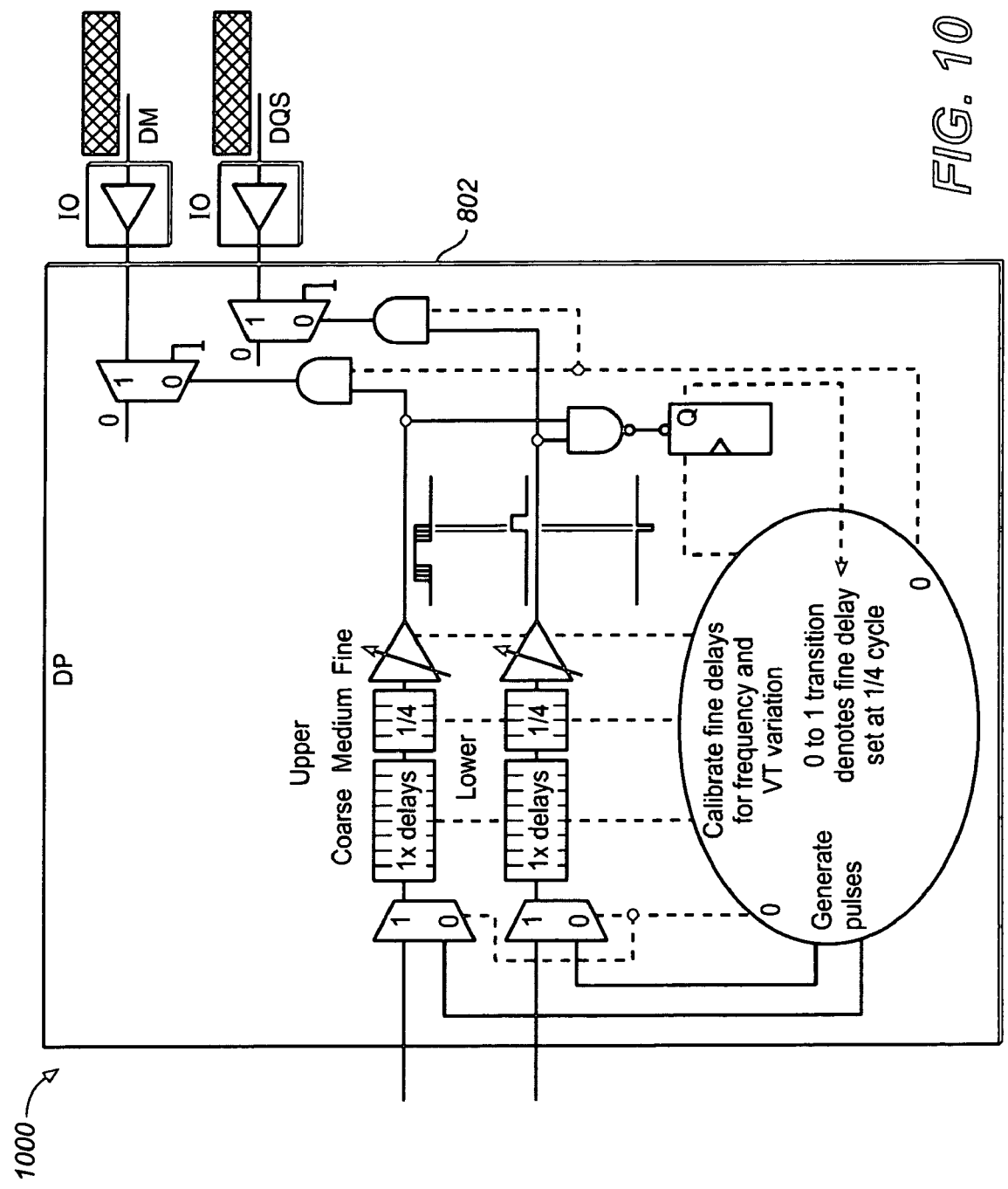
Figure 11:
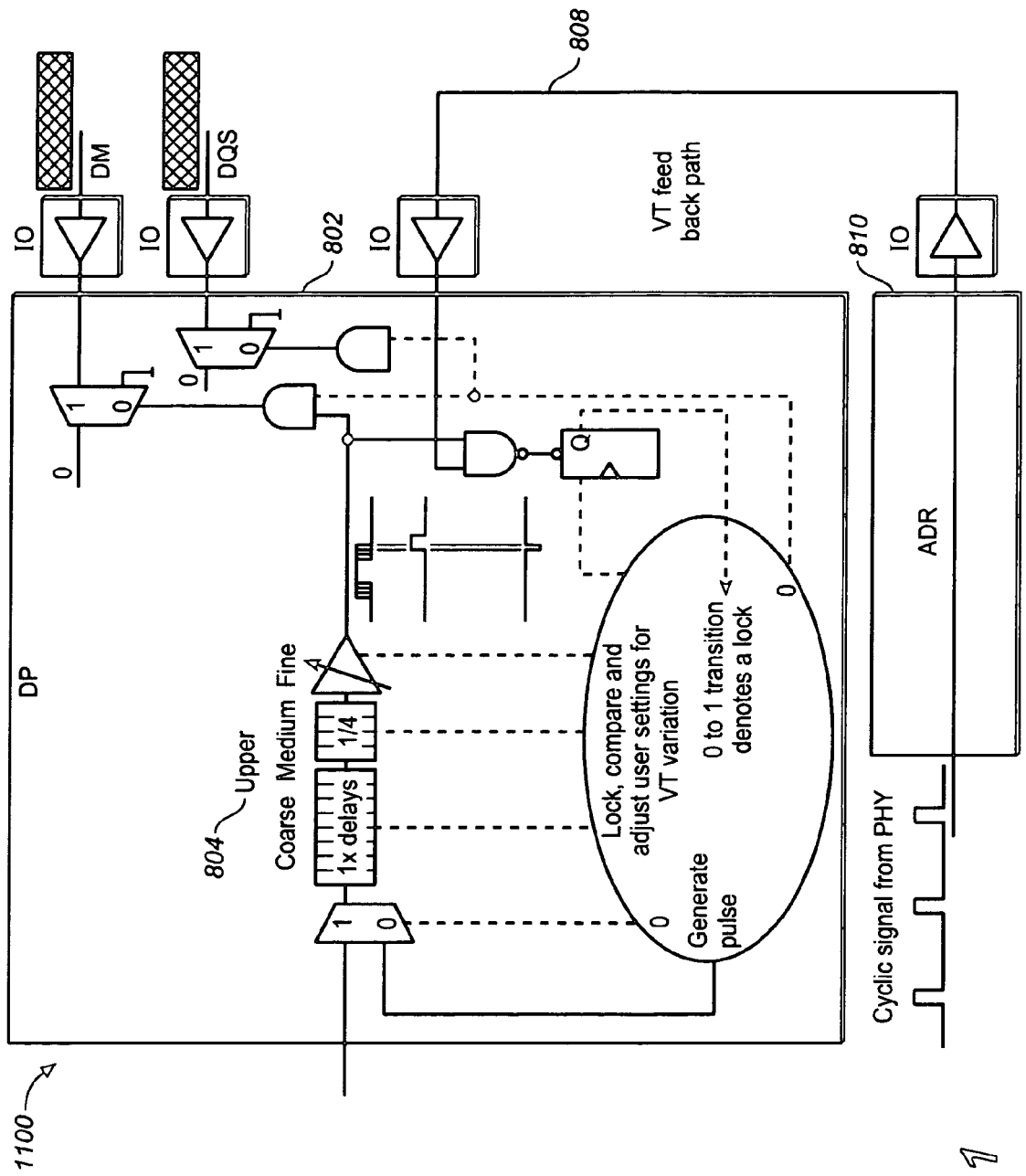

Referring generally to FIGS. 6 and 7, prior art embodiments of systems for gating bi-directional data strobes, such as SDRAM bi-directional data strobes (DQS) are shown. The main goals of gating bi-directional data strobes include preventing unwanted write strobes and idle period noise from entering a read path of a memory controller. Said goals may be achieved by controlling the timing of gating logic, so that gating coincides with DQS read data burst. Two methods currently implemented for gating bi-directional data strobes are the programmable delay method (i.e., "programmable gateon") and the board trace feedback method (i.e., "feedback gateon"). FIGS. 6 and 7 illustrate prior art systems implementing the programmable gateon method and the feedback gateon methods respectively. Programmable gateon removes process variation, but suffers from VT variation, which may cause gating failure at higher frequencies, such as above 600 MHz. Feedback gateon removes VT variation, but falls short in that it fails to remove process variation.

Referring generally to FIGS. 8-11, a system for providing programmable delay read data strobe gating (i.e., programmable gateon) with VT compensation is shown. In a present embodiment, the system 800 includes a state machine 802, such as a DP programmable gateon state machine. The state machine 802 may further include programmable delay configured for monitoring VT change, the programmable delay lines including an upper delay line 804 and a lower delay line 806. For instance, the programmable delay lines may be DP programmable gateon delay lines, read path DQS delay lines or the like. In an exemplary embodiment, the state machine 802 further includes a feedback path 808 for tracking VT variation. Further, the feedback path 808 may be configured for connecting the state machine 802 to an ADR (Automated Dynamic Reconfiguration) hard macro 810 which is externally located from the state machine 802. For example, the feedback path 808 may be an ADR to DP gateon feedback path for tracking VT variation of the ADR's clock path, including VT variation detected across the ADR's clock tree, through CK I/O and DQS I/O. In exemplary embodiments, the feedback path 808 may be used with up to four state machines 802 (ex—DPs), absolute delay being irrelevant. (see FIG. 9). In current embodiments, the system 800 may further include an integrated circuit 812, such as a DDR2 PHY (Double Data Rate 2) chip, connected to the ADR hard macro 810 and the state machine 802. The integrated circuit 812 is configured for providing a periodical signal (i.e., feedback signal) which serves as a reference signal for providing VT compensation. The integrated circuit 812 may transmit the feedback signal to the ADR hard macro 810 via a gateon feedback port of the ADR hard macro 810. In exemplary embodiments, the ADR hard macro 810 is configured for reducing pulse width of the feedback signal. The feedback signal may then be transmitted from the ADR hard macro 810 to the state machine 802, via the feedback path 808 to serve as a reference signal for VT compensation. The state machine 802 may require shielding at driver and receiver I/Os.

Figure 17:
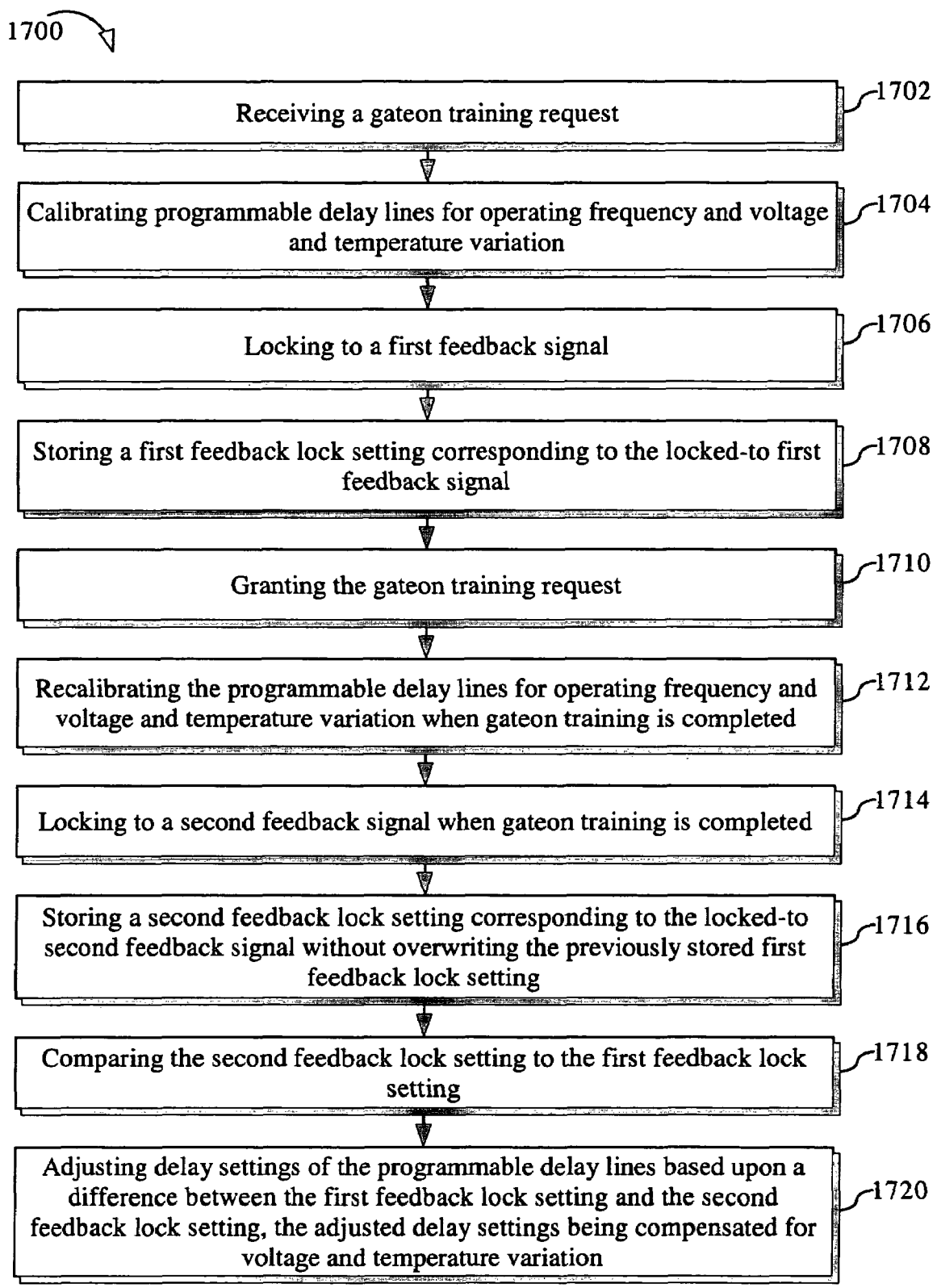
FIGS. 17-19 illustrate a method for providing programmable delay read data strobe gating with voltage and temperature compensation in accordance with an exemplary embodiment of the present invention.
Figure 18:
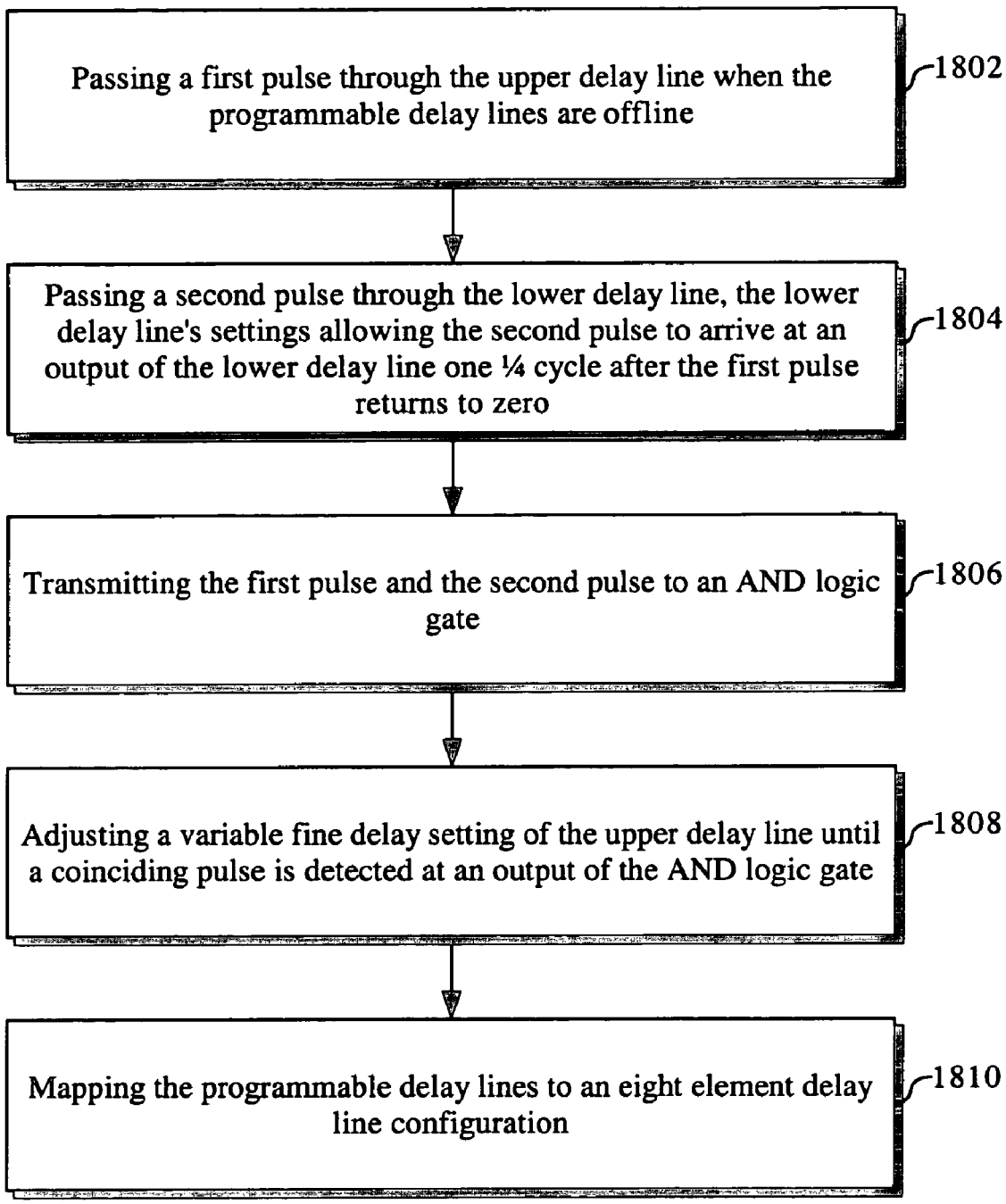
Figure 19:
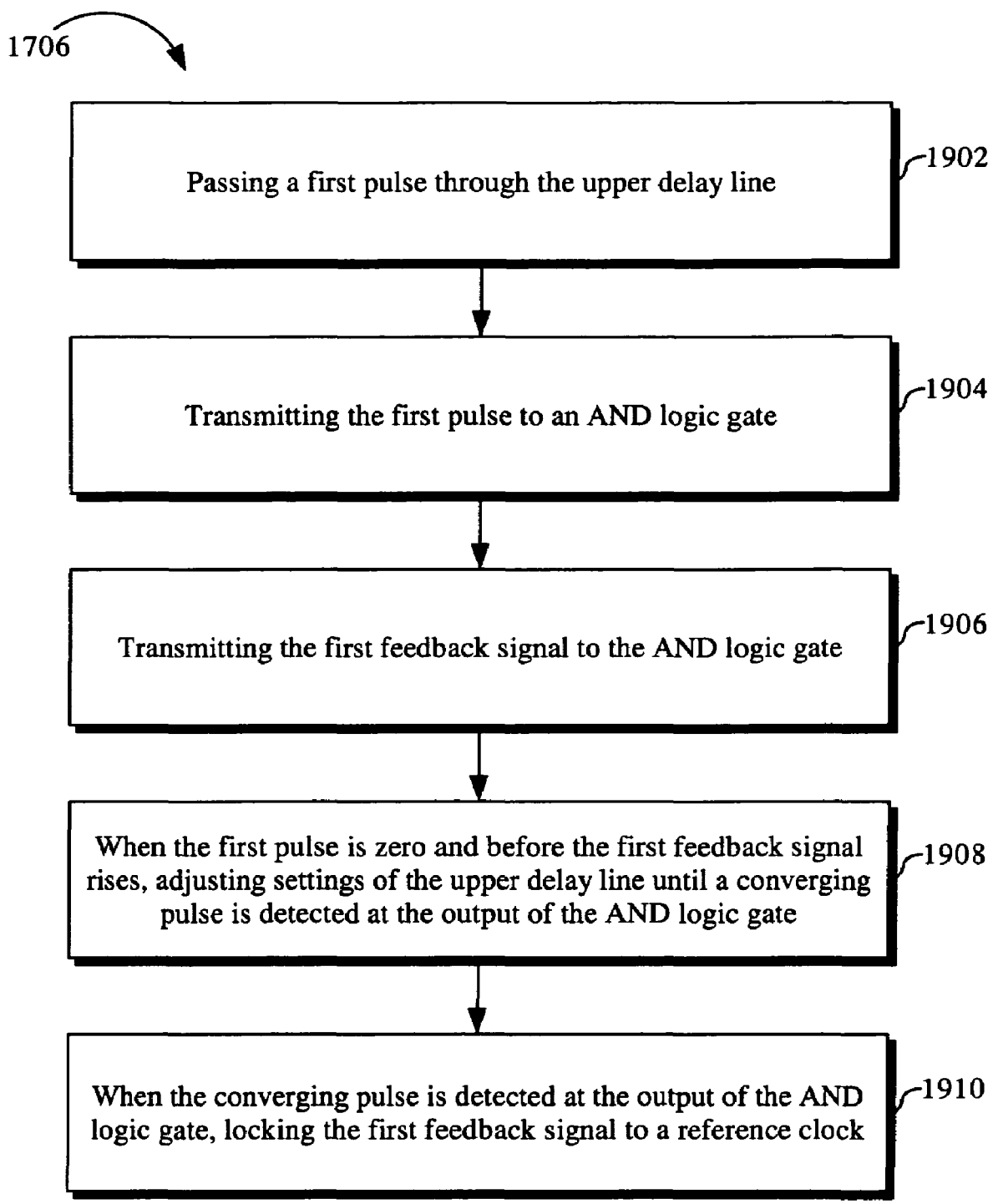

Referring generally to FIGS. 17-19, a method for providing programmable delay read data strobe gating (i.e., programmable gateon) with voltage and temperature compensation is shown. The method 1700 includes the step of receiving a training request 1702. For example, the training request, such as a gateon training request, may be received by the state machine 802 from a user when the user asserts a DR_TRAINING_REQ_IN pin. The method 1700 further includes the step of calibrating programmable delay lines for operating frequency and voltage and temperature variation 1704. For example, the programmable delay lines (804, 806) may each include a variable fine delay having 16 element delays. Further, each element delay of the variable fine delay may be 60 to 120 ps (picoseconds). In the exemplary embodiment, settings of the variable fine delays of the programmable delay line may be calibrated and/or adjusted for operating frequency and voltage and temperature variation on a continuous basis. In additional embodiments, calibration 1704 occurs only when the programmable delay lines (804, 806) are offline. (i.e., when no read operations are taking place).

In an exemplary embodiment, the calibrating step 1704 further includes the step of passing a first pulse through the upper delay line 804 when the programmable delay lines (804, 806) are offline 1802. In further embodiments, the calibrating step 1704 further includes the step of passing a second pulse through the lower delay line, the lower delay line's settings allowing the second pulse to arrive at an output of the lower delay line one ¼ cycle after the first pulse returns to zero 1804. In additional embodiments, the calibrating step 1704 further includes transmitting the first pulse and the second pulse to an AND logic gate 1806. For instance, the first and second pulses are anded together via the AND logic gate and the state machine 802 then monitors an output of the AND logic gate. In still further embodiments, the calibrating step 1704 further includes adjusting a variable fine delay setting of the upper delay line until a coinciding pulse is detected at an output of the AND logic gate 1808. For example, the variable fine delay setting of the upper delay line 804 may be increased from 0 to 15. In the exemplary embodiment, the coinciding pulse is generated when the first pulse and the second pulse coincide at the AND logic gate. In the present embodiment, it may be assumed that the variable fine delay setting at which the coinciding pulse is generated is a correct setting for ¼ cycle. In still further embodiments, the calibrating step 1704 further includes mapping the programmable delay lines to an eight element delay line configuration 1810. For example, delay lines utilized with prior gating methods may have had a variable fine delay of 8 elements, while the variable fine delays of the programmable delay lines of the present invention may have 16 elements. Therefore, in order to allow the programmable delay lines of the present invention (804, 806) to be compatible for external use with previous programmable delay lines, the variable fine delay elements of the programmable delay lines of the present invention may need to be mapped to the 8 element delay line configuration. (for example, as shown in TABLE 1 below). In exemplary embodiments, the mapping step 1810 may be achieved via utilization of the variable fine delay setting of the upper delay line which produces the coinciding pulse.

TABLE 1

MAPPING OF FINE DELAY ELEMENTS, 8 TO 16

| External Delay Fine Setting | Actual Fine Delay Setting The X numbers represent the scaling factor of the mapping function | | | | | | |
|---|---|---|---|---|---|---|---|
| | X 0.50 | X 0.75 | X 1.00 | X 1.25 | X 1.50 | X 1.75 | X 2.00 |
| 0 | 0 | 0 | 0 | 0 | 0 | 0 | 0 |
| 1 | 0 | 1 | 1 | 1 | 2 | 2 | 2 |
| 2 | 1 | 1 | 2 | 3 | 3 | 4 | 5 |
| 3 | 1 | 2 | 3 | 4 | 5 | 6 | 7 |
| 4 | 2 | 3 | 4 | 5 | 6 | 7 | 9 |
| 5 | 2 | 3 | 5 | 7 | 8 | 9 | 11 |
| 6 | 3 | 4 | 6 | 8 | 9 | 11 | 13 |
| 7 | 3 | 5 | 7 | 9 | 11 | 13 | 15 |

In current embodiments, the method for providing programmable delay read data strobe gating with voltage and temperature compensation 1700 further includes the step of locking to a first feedback signal 1706. In additional embodiments, the step of locking to a first feedback signal 1706 includes the step of passing a first pulse through the upper delay line 1902. The locking step 1706 may further include the step of transmitting the first pulse to an AND logic gate 1904. The locking step 1706 may further include the step of transmitting the first feedback signal to the AND logic gate 1906. The locking step 1706 may further include, when the first pulse is zero and before the first feedback signal rises, adjusting settings of the upper delay line until a converging pulse is detected at the output of the AND logic gate 1908. In the exemplary embodiment, the converging pulse is generated when the first pulse and the first feedback signal converge at the AND logic gate. The state machine 802 provides coarse lock of the first pulse and the first feedback signal by adding extra system cycles to its routine, thereby causing the first pulse and the first feedback signal to converge. In current embodiments, the locking step 1706 further includes, when the converging pulse is detected at the output of the AND logic gate, locking the first feedback signal to a reference clock 1910. The settings of the upper delay line 804 which produce the converging pulse are used for achieving final lock.

In further embodiments, the method for providing programmable delay read data strobe gating with voltage and temperature compensation 1700 further includes the step of storing a first feedback lock setting corresponding to the locked-to first feedback signal 1708. In exemplary embodiments, the calibrating 1704, locking 1706 and storing 1708 steps may be repeated, with the feedback lock setting being overwritten (the last stored feedback lock setting being the reference for future VT compensation) until gateon training begins. The method 1700 may further include the step of granting the training request (ex.—gateon training request) 1710. For example, the state machine 802 may grant the request by asserting DR_READY_OUT and DR_ALLOW_TRAINING_OUT pins. It should be noted that during user gateon training VT compensation is not performed. Further feedback lock settings are not updated.

In present embodiments, the method for providing programmable delay read data strobe gating with voltage and temperature compensation 1700 further includes the step of recalibrating the programmable delay lines for operating frequency and voltage and temperature variation when training (ex.—gateon training) is completed 1712. For example, training may be completed or terminated when the user de-asserts the training request. The method 1700 may further include locking to a second feedback signal when training (ex—gateon training) is completed 1714. In further embodiments, the method 1700 further includes storing a second feedback lock setting corresponding to the locked-to second feedback signal without overwriting the previously stored first feedback lock setting 1716. The method 1700 may further include comparing the second feedback lock setting to the first feedback lock setting 1718. In an exemplary embodiment, the state machine 802 may be configured for detecting a feedback signal change of up to +/−1 system clock cycle. The method 1700 may further include adjusting delay settings of the programmable delay lines based upon a difference between the first feedback lock setting and the second feedback lock setting, the adjusted delay settings being compensated for voltage and temperature variation 1720.

In additional embodiments, it is further noted that feedback signal must be running with VT compensation selected before the state machine 802 has granted the training request, if not, the state machine must be re-set via soft reset. The soft reset forces the state machine 802 through its startup routine where it may readjust for VT feedback requirements. In further embodiments, when VT compensation is selected a lower limit for coarse settings of the programmable delay lines may be 2, which provides a margin for the system 800 to adjust the coarse setting. In still further embodiments, a fine delay scaling factor may be set to ×1.00 when VT compensation is powered off.

Figure 12:
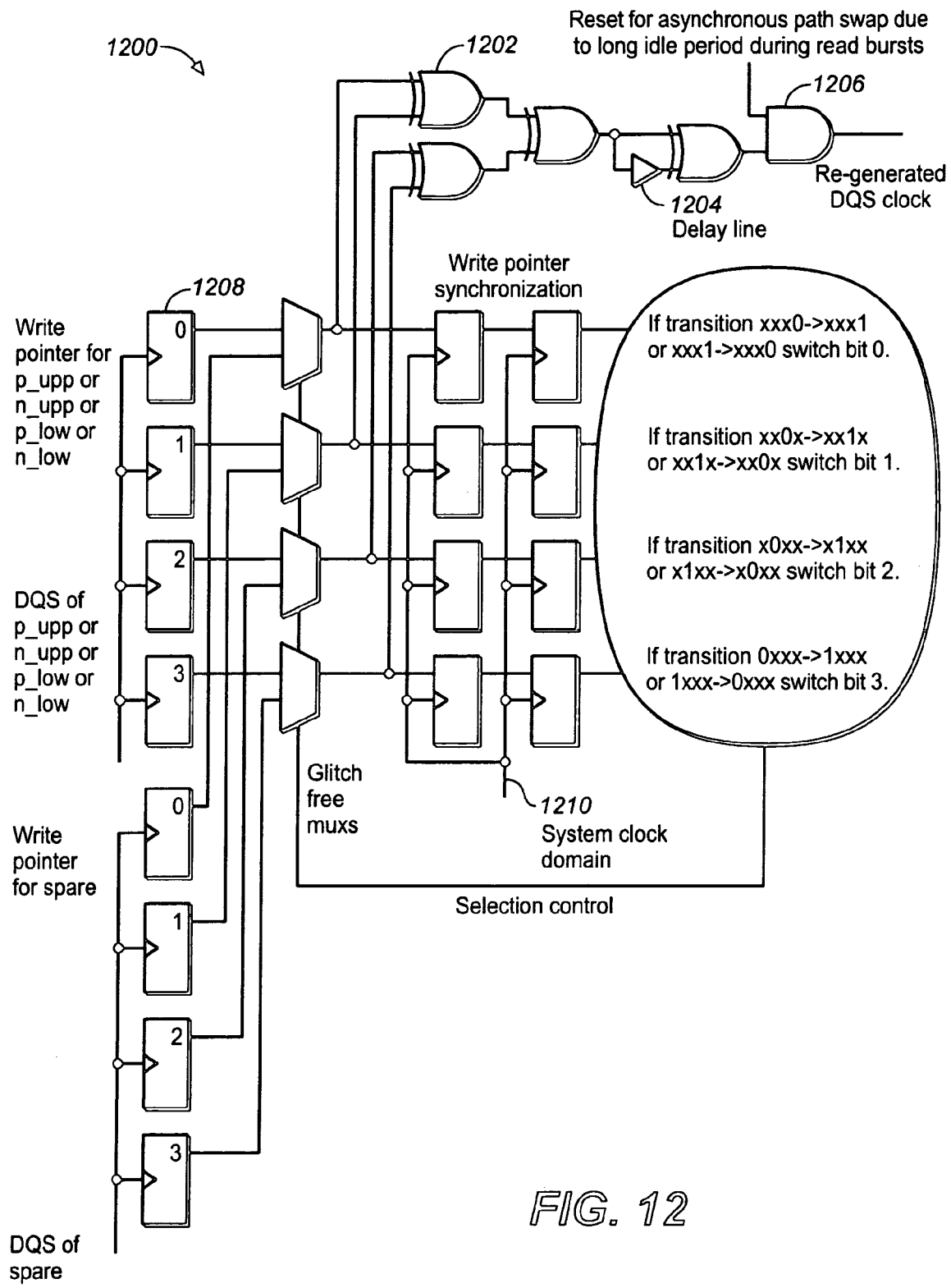
FIG. 12 illustrates a system for DQS (Data Strobe Signal) clock/write pointer clock re-generation in accordance with an exemplary embodiment of the present invention.

Referring to FIG. 12, a system 1200 for DQS (Data Strobe Signal) clock/write pointer clock re-generation is shown in accordance with an exemplary embodiment. The system 1200 includes a plurality of XOR logic gates 1202 connected to a delay line 1204, the delay line being further connected to an AND logic gate 1206. The plurality of XOR logic gates 1202, working in conjunction with the delay line 1204 are configured for re-generating a DQS (Data Strobe Signal) clock. In a present embodiment, the XOR logic gates 1202 and the delay line 1204 create a falling (i.e., negative) edge of a re-generated DQS (Data Strobe Signal) clock. In current embodiments, only the rising edge of the re-generated DQS clock needs to have accurate timing, thus the delay line 1204 doesn't have to be accurate. However, in exemplary embodiments, the delay line 1204 is configured with sufficient delay for meeting minimum pulse width requirements. In further embodiments, the AND logic gate 1206 is configured for removing a burst DQS clocking-generated pulse, the pulse being generated via asynchronous reset of all write pointers during read idle periods. The system 1200 further includes a plurality of write pointers 1208 connected to the plurality of XOR logic gates 1202, wherein the XOR logic gates 1202 and the delay line 1204 re-generate the DQS clock from first (offline) and second (online) write pointers included in the plurality of write pointers 1208. In present embodiments, the plurality of write pointers 1208 are configured as 4-bit Gray-coded write pointers to allow for re-generation of the DQS clock, to retain continuous DQS clock properties (even at a system operating frequency for example of up to 800 MHz, while also allowing bypassing of 4-bit deep FIFOs 114 (see FIG. 1). Examples of 4-bit Gray code for use with the write pointers 1208 of the present invention are shown in Table 2 below. The 4-bit Gray code write pointers of the present invention allow for static switching of bits between the write pointers 1208 within the system clock domain 1210. In the current embodiment, the XOR logic gates 1202 and delay line 1204 are configured for re-generating the DQS clock from a signal received from swapped write pointers 1208 within the system clock domain 1210. The system 1200 of the present invention allows for glitch-free (without data flow interruption) regeneration of DQS clocks/write pointer clocks from the write pointers' registers. The system 1200 of the present invention further allows for glitch-free swapping of write pointer register bits, regardless of burst clock DQS or continuous clock DQS. Additionally, DQS clock regeneration and write pointer register bit swapping all within the system clock domain.

TABLE 2

EXAMPLE OF 4 AND 2 BIT GRAY CODE

| 4 bit Gray code | 2 bit Gray code |
|---|---|
| 0000 | 00 |
| 0001 | 01 |
| 0011 | 11 |
| 0111 | 10 |
| 1111 | 00 |
| 1110 | 01 |
| 1100 | 11 |
| 1000 | 10 |

Figure 13:
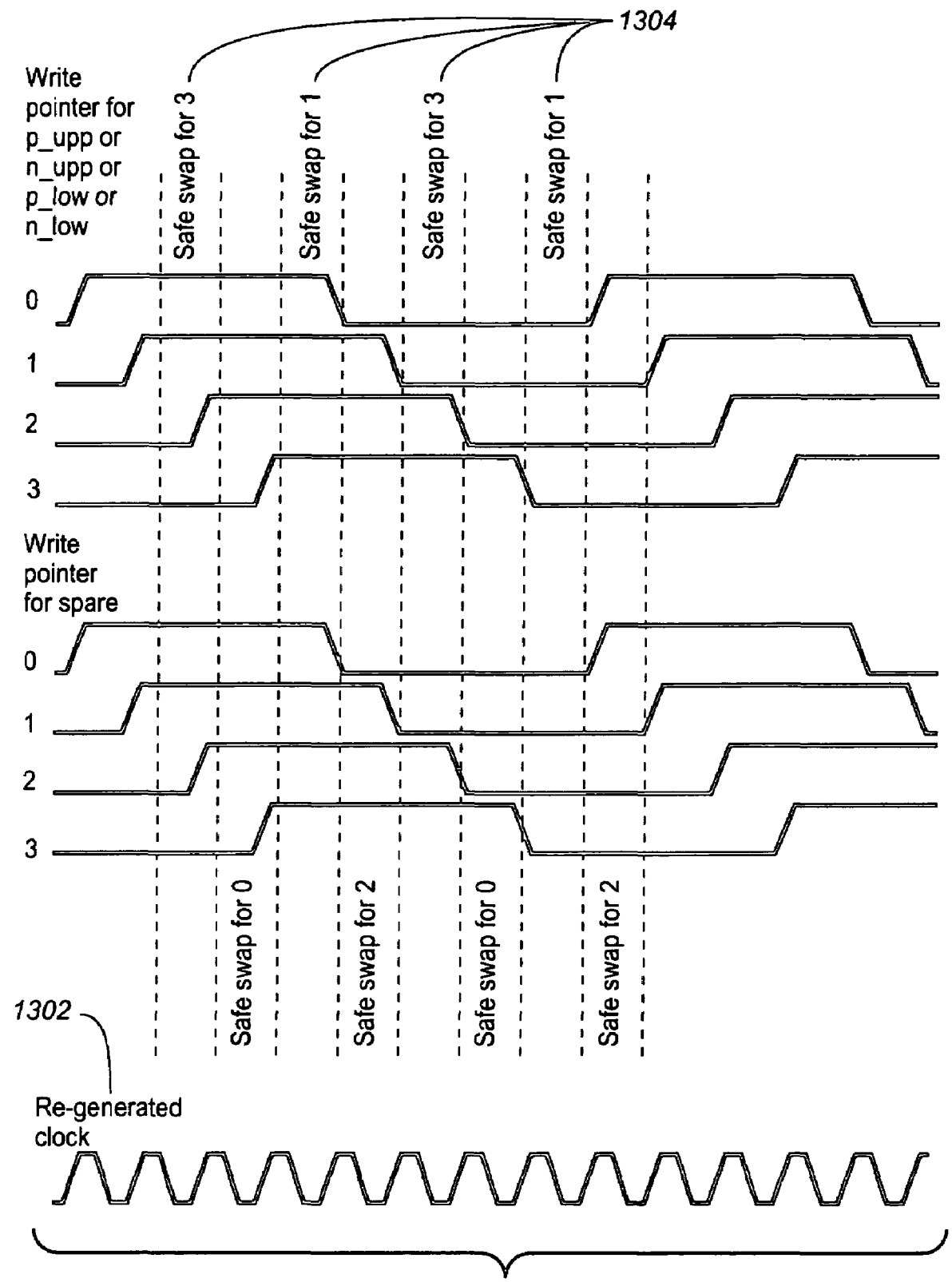
FIG. 13 illustrate DQS (Data Strobe Signal) domain waveforms of write pointers for continuous clock or read burst DQS (Data Strobe Signal) in accordance with an exemplary embodiment of the present invention.

Referring to FIG. 13, DQS domain waveforms of the write pointers 1208 for continuous clock or read burst DQS are shown. The regenerated clock waveform 1302, is of the regenerated DQS clock from the write pointers 1208. System clock domain earliest and latest control timing intervals 1304 (i.e., safe swap intervals) of the write pointer swap process in accordance with an exemplary embodiment of the present invention are also shown. Due to asynchronous clock boundary and random start of swapping (swap process), each pair of bits may be swapped within any of the intervals 1304 shown.

Figure 22:
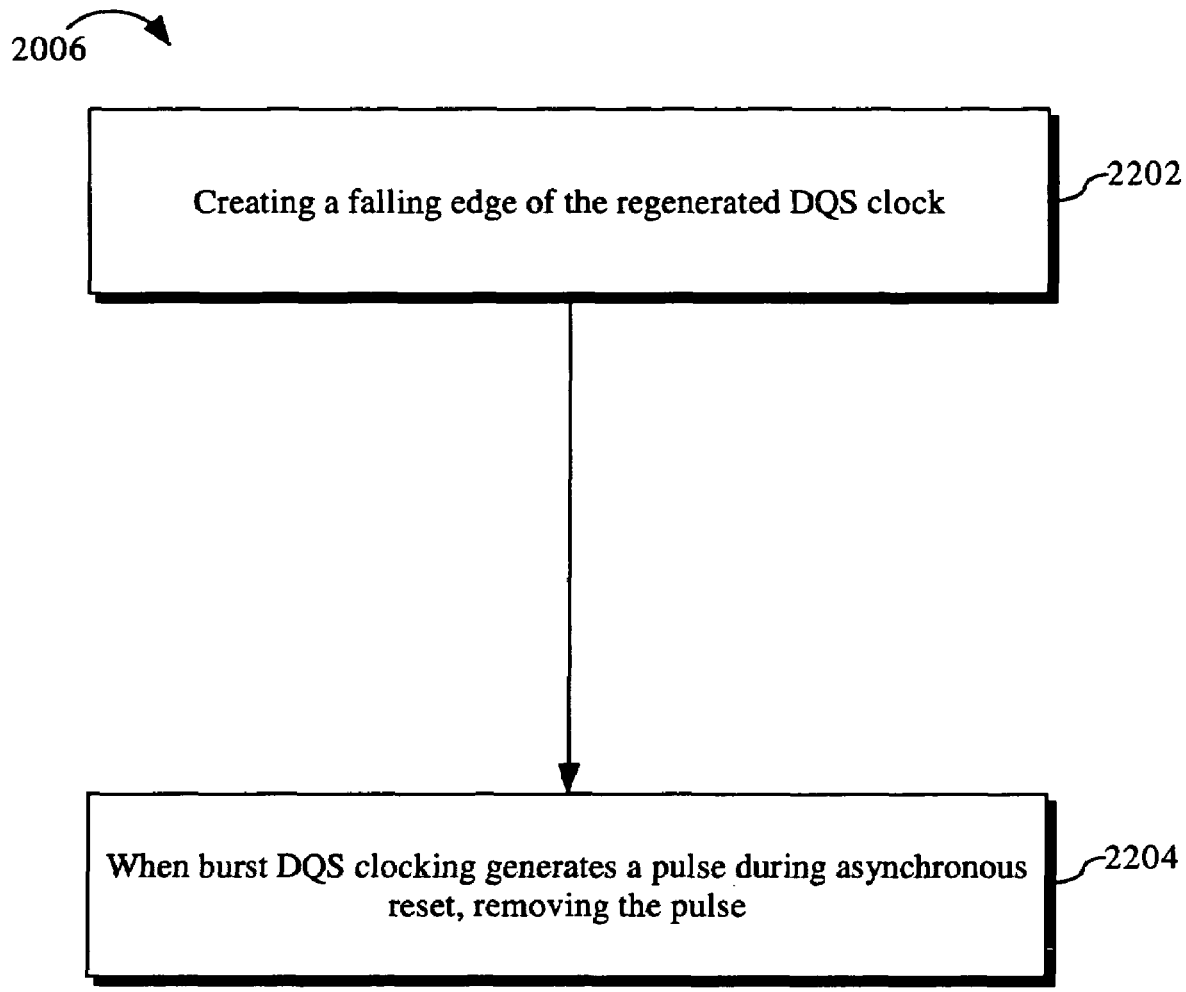

Referring generally to FIGS. 20-22, a method for asynchronous clock regeneration in accordance with an exemplary embodiment of the present invention is shown. The method 2000 includes the step of synchronizing a first write pointer and a second write pointer, the first write pointer being an offline write pointer, the second write pointer being an online write pointer 2002. The method 2000 further includes swapping at least one bit from the first write pointer with at least one bit of the second write pointer when the bits are static 2004. The method 2000 further includes regenerating a DQS (Data Strobe Signal) clock 2006. In further embodiments, swapping occurs in a sequence determined in a system clock domain 1210. In additional embodiments, the step of regenerating a DQS clock 2006 includes creating a falling edge of the regenerated DQS (Data Strobe Signal) clock 2202. In further embodiments, the step of regenerating a DQS clock 2006 further includes, when burst DQS (Data Strobe Signal) clocking generates a pulse during asynchronous reset, removing the pulse 2204. In the present embodiment, regeneration of the DQS clock 2006 allows for bypassing of FIFOs, thereby preserving minimum read path latency.

In an exemplary embodiment, the synchronizing step 2002 includes allowing the first write pointer to sample data from the second write pointer for synchronizing the write pointers, the first write pointer being communicatively coupled with the second write pointer 2102. The present invention allows for the data to be sampled directly from within a DQS (Data Strobe Signal) domain. The synchronizing step 2002 may further include utilizing sampled data for determining when the bits are static 2104.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method providing for data path voltage and temperature compensation for a circuit device, the method comprising:

configuring an offline data path to match an online data path using a processing unit;

compensating the offline data path for voltage and temperature variation via the processing unit; and swapping the off line data path with the online data path, wherein the swapping occurs automatically without interruption of data flow along data paths in use.

2. The method as claimed in claim 1, wherein the compensating the offline data path for voltage and temperature variation includes:

determining a base delay setting for the offline data path, the base delay setting equaling the sum of aligned delay and ¼ cycle delay.

3. The method as claimed in claim 2, wherein the compensating the offline data path for voltage and temperature variation further includes:

storing an offset for the online data path, the offset being received as a user input during a data eye training.

4. The method as claimed in claim 3, wherein the compensating the offline data path for voltage and temperature variation further includes:

converting the offset for the online data path into a ratio of ¼ cycle delay over offset.

5. The method as claimed in claim 4, wherein the compensating the offline data path for voltage and temperature variation further includes:

storing the ratio by overwriting the offset.

6. The method as claimed in claim 5, wherein the compensating the offline data path for voltage and temperature variation further includes:

providing an adjusted delay setting based upon the ratio of ¼ of cycle delay, the adjusted delay setting being voltage and temperature compensated.

7. The method as claimed in claim 6, wherein the compensating the offline data path for voltage and temperature variation further includes:

adjusting a clock path programmable delay of an off line clock path based upon the voltage and temperature compensated adjusted delay setting for allowing the clock path programmable delay to strobe data of the offline data path in a center of an eye pattern.

8. The method as claimed in claim 1, wherein swapping the offline data path with the online data path includes:

connecting a write pointer of a FIFO of the offline data path with a write pointer of a FIFO of the online data path; and allowing the write pointer of the FIFO of the off line data path to become synchronous with the write pointer of the FIFO of the online data path.

9. The method as claimed in claim 8, wherein the swapping of the offline data path with the online data path occurs at outputs of the offline data path FIFO and the online data path FIFO.

10. The method as claimed in claim 9, wherein the swapping of the offline data path with the online data path occurs when the offline data path FIFO and the online data path FIFO have been read.

11. A computer-readable medium having computer-executable instructions to be executed by a computer for performing a method for providing data path voltage and temperature compensation for circuit device, said method comprising:

configuring an offline data path using a processing unit to match an online data path;

compensating the offline data path for voltage and temperature variation via the processing unit; and swapping the offline data path with the online data path, wherein the swapping occurs automatically without interruption of data flow along data paths in use.

12. The computer-readable medium as claimed in claim 11, wherein the compensating the offline data path for voltage and temperature variation includes:

determining a base delay setting for the offline data path, the base delay setting equaling the sum of aligned delay and ¼ cycle delay.

13. The computer-readable medium as claimed in claim 12, wherein the compensating the offline data path for voltage and temperature variation further includes:

storing an offset for the online data path, the offset being received as a user input during a data eye training.

14. The computer-readable medium as claimed in claim 13, wherein the compensating the offline data path for voltage and temperature variation further includes:

converting the offset for the online data path into a ratio of ¼ cycle delay over offset.

15. The computer-readable medium as claimed in claim 14, wherein the compensating the offline data path for voltage and temperature variation further includes:

storing the ratio by overwriting the offset.

16. The computer-readable medium as claimed in claim 15, wherein the compensating the offline data path for voltage and temperature variation further includes:

providing an adjusted delay setting based upon the ratio of ¼ cycle delay, the adjusted delay setting being voltage and temperature compensated.

17. The computer-readable medium as claimed in claim 16, wherein the compensating the offline data path for voltage and temperature variation further includes:

adjusting a clock path programmable delay of an offline clock path based upon the voltage and temperature compensated adjusted delay setting for allowing the clock path programmable delay to strobe data of the offline data path in a center of an eye pattern.

18. The computer-readable medium as claimed in claim 11, wherein the swapping the offline data path with the online data path includes:

connecting a write pointer of a FIFO of the offline data path with a write pointer of a FIFO of the online data path; and allowing the write pointer of the FIFO of the offline data path to become synchronous with the write pointer of the FIFO (First-In First-Out Data Buffer) of the online data path.

19. The computer-readable medium as claimed in claim 18, wherein the swapping of the offline data path with the online data path occurs at outputs of the offline data path FIFO and the online data path FIFO.

20. A system providing for data path voltage and temperature compensation for a circuit device, the system comprising:

means for configuring an offline data path to match an online data path;

means for compensating the offline data path for voltage and temperature variation; and means for swapping the off line data path with the online data path, wherein the swapping occurs automatically without interruption of data flow along data paths in use.

* * * * *